(12) United States Patent  
Carlson

(10) Patent No.: US 7,046,370 B2  
(45) Date of Patent: May 16, 2006

(54) INTERFEROMETER WITH REDUCED SHEAR

(75) Inventor: Andrew Eric Carlson, Higganum, CT (US)

(73) Assignee: Zygo Corporation, Middlefield, CT (US)

( * ) Notice: Subject to any disclaimer, the term of this patent is extended or adjusted under 35 U.S.C. 154(b) by 445 days.

(21) Appl. No.: 10/603,120

(22) Filed: Jun. 24, 2003

(65) Prior Publication Data

US 2004/0047027 A1     Mar. 11, 2004

Related U.S. Application Data

(60) Provisional application No. 60/391,344, filed on Jun. 24, 2002.

(51) Int. Cl.
   *G01B 9/02*     (2006.01)

(52) U.S. Cl. ........................................... 356/493

(58) Field of Classification Search .............. 356/491, 356/493, 498, 520

See application file for complete search history.

(56) References Cited

U.S. PATENT DOCUMENTS

| 5,200,797 A | 4/1993 | Tank et al. ............... 356/363 |
| 5,471,304 A | 11/1995 | Wang ....................... 356/358 |
| 5,675,412 A | 10/1997 | Solomon ................... 356/345 |
| 5,757,491 A | 5/1998 | Cai et al. .................. 356/358 |
| 6,201,609 B1 | 3/2001 | Hill et al. .................. 356/491 |
| 6,791,693 B1 * | 9/2004 | Hill .......................... 356/500 |
| 6,806,960 B1 * | 10/2004 | Bagwell et al. ........... 356/487 |
| 2003/0053079 A1 | 3/2003 | Hill .......................... 356/520 |

* cited by examiner

*Primary Examiner*—Gregory J. Toatley, Jr.
*Assistant Examiner*—Michael A. Lyons
(74) *Attorney, Agent, or Firm*—Fish & Richardson P.C.

(57) ABSTRACT

An interferometer that includes a first beam-splitting surface positioned to separate an input beam into a first beam and a second beam. A first set of optics is positioned to receive the first beam, direct it to contact a first reflector multiple times and produce a first intermediate beam. The first intermediate beam follows a nominal output path when the first reflector has a first alignment normal to the first beam prior to reflection by the first reflector. The first set of optics includes a second beam-splitting surface, a third beam-splitting surface, and a first fold optic that are positioned to reduce displacement of the first intermediate beam from the nominal output path when the first reflector has an alignment different from the first alignment.

52 Claims, 12 Drawing Sheets

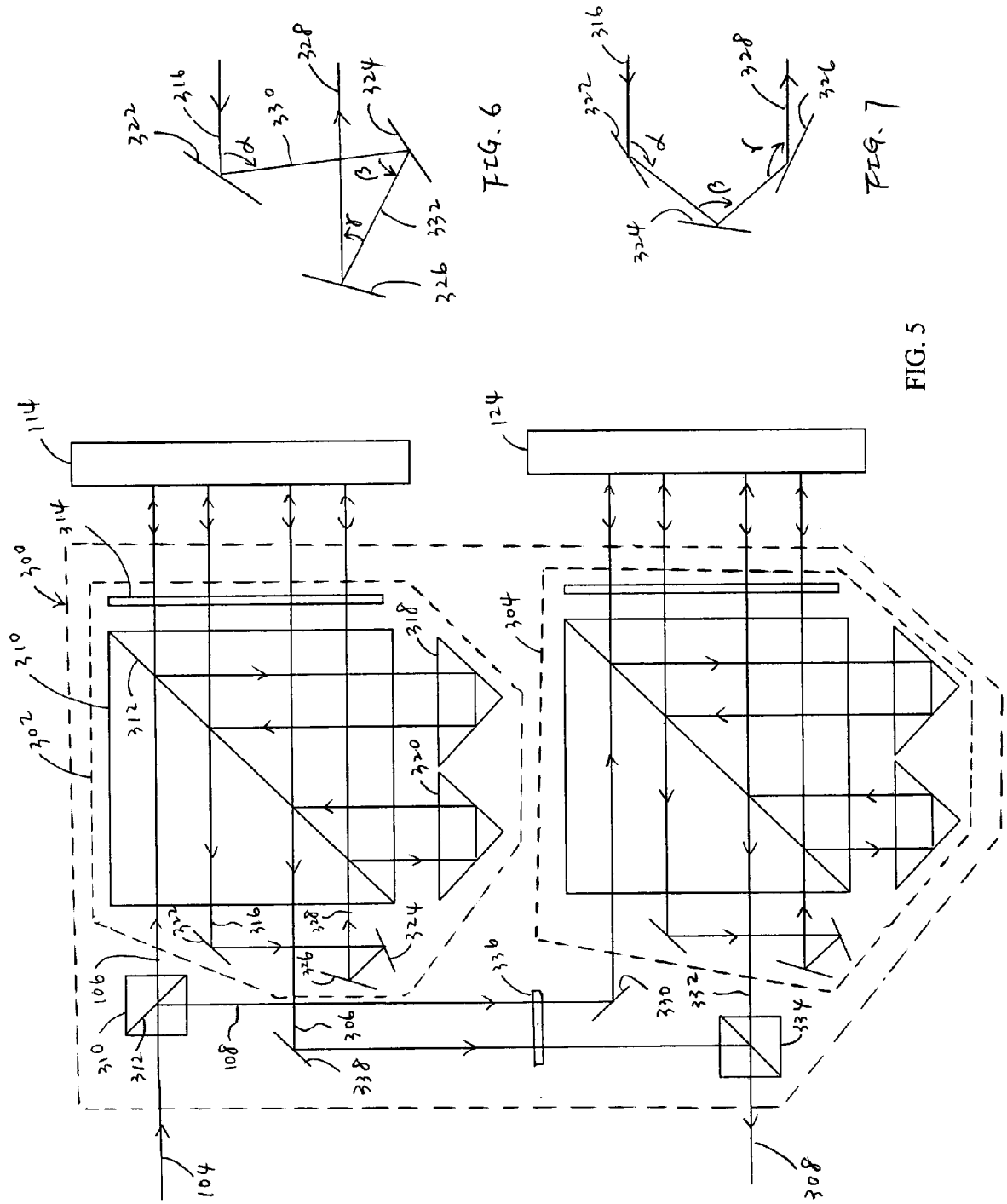

INTERFEROMETER WITH REDUCED SHEAR

RELATED APPLICATIONS

This application claims priority to U.S. provisional application ser. No. 60/391,344, filed on Jun. 24, 2002, entitled "Athermal Zero Shear Plane Mirror Interferometer," to Andrew E. Carlson. The content of the provisional application is hereby incorporated herein by reference.

BACKGROUND

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam splitter to direct the measurement and reference beams to the measurement and reference objects, respectively, and combine the reflected measurement and reference beams to form overlapping exit measurement and reference beams. The overlapping exit beams form an output beam that subsequently passes through a polarizer.

The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams. A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where n is the relative speed of the measurement and reference objects, $\lambda$ is the wavelength of the measurement and reference beams, n is the refractive index of the medium through which the light beams travel, e.g., air or vacuum, and p is the number of passes to the reference and measurement objects. Changes in the relative position of the measurement object correspond to changes in the phase of the measured interference signal, with a $2\pi$ phase change substantially equal to a distance change L of $\lambda/(np)$, where L is a round-trip distance change, e.g., the change in distance to and from a stage that includes the measurement object.

Unfortunately, this equality is not always exact. In addition, the amplitude of the measured interference signal may be variable. A variable amplitude may subsequently reduce the accuracy of measured phase changes. Many interferometers include non-linearities such as what are known as "cyclic errors." The cyclic errors can be expressed as contributions to the phase and/or the intensity of the measured interference signal and have a sinusoidal dependence on the change in optical path length pnL. In particular, the first harmonic cyclic error in phase has a sinusoidal dependence on $(2\pi pnL)/\lambda$ and the second harmonic cyclic error in phase has a sinusoidal dependence on $2(2\pi pnL)/\lambda$. Higher harmonic cyclic errors and sub-harmonic cyclic errors can also be present.

There are also "non-cyclic non-linearities" such as those caused by a change in lateral displacement (i.e., "beam shear") between the reference and measurement beam components of an output beam of an interferometer when the wavefronts of the reference and measurement beam components have wavefront errors. This can be explained as follows.

Inhomogeneities in the interferometer optics may cause wavefront errors in the reference and measurement beams. When the reference and measurement beams propagate collinearly with one another through such inhomogeneities, the resulting wavefront errors are identical and their contributions to the interferometric signal cancel each other out. More typically, however, the reference and measurement beam components of the output beam are laterally displaced from one another, i.e., they have a relative beam shear. Such beam shear causes the wavefront errors to contribute an error to the interferometric signal derived from the output beam.

Moreover, in many interferometry systems beam shear changes as the position or angular orientation of the measurement object changes. For example, a change in relative beam shear can be introduced by a change in the angular orientation of a plane mirror measurement object. Accordingly, a change in the angular orientation of the measurement object produces a corresponding error in the interferometric signal.

The effect of the beam shear and wavefront errors will depend upon procedures used to mix components of the output beam with respect to component polarization states and to detect the mixed output beam to generate an electrical interference signal. The mixed output beam may for example be detected by a detector without any focusing of the mixed beam onto the detector, by detecting the mixed output beam as a beam focused onto a detector, or by launching the mixed output beam into a single mode or multi-mode optical fiber and detecting a portion of the mixed output beam that is transmitted by the optical fiber. The effect of the beam shear and wavefront errors will also depend on properties of a beam stop should a beam stop be used in the procedure to detect the mixed output beam. Generally, the errors in the interferometric signal are compounded when an optical fiber is used to transmit the mixed output beam to the detector.

Amplitude variability of the measured interference signal can be the net result of a number of mechanisms. One mechanism is a relative beam shear of the reference and measurement components of the output beam that is for example a consequence of a change in orientation of the measurement object.

In dispersion measuring applications, optical path length measurements are made at multiple wavelengths, e.g., 532 nm and 1064 nm, and are used to measure dispersion of a gas in the measurement path of the distance measuring interferometer. The dispersion measurement can be used in converting the optical path length measured by a distance measuring interferometer into a physical length. Such a conversion can be important since changes in the measured optical path length can be caused by gas turbulence and/or by a change in the average density of the gas in the measurement arm even though the physical distance to the measurement object is unchanged.

The interferometers described above are often crucial components of scanner systems and stepper systems used in lithography to produce integrated circuits on semiconductor wafers. Such lithography systems typically include a translatable stage to support and fix the wafer, focusing optics used to direct a radiation beam onto the wafer, a scanner or stepper system for translating the stage relative to the exposure beam, and one or more interferometers. Each interferometer directs a measurement beam to, and receives a reflected measurement beam from, a plane mirror attached to the stage. Each interferometer interferes its reflected measurement beams with a corresponding reference beam, and collectively the interferometers accurately measure changes in the position of the stage relative to the radiation beam. The interferometers enable the lithography system to precisely control which regions of the wafer are exposed to the radiation beam.

In many lithography systems and other applications, the measurement object includes one or more plane mirrors to reflect the measurement beam from each interferometer. Small changes in the angular orientation of the measurement object, e.g., pitch and yaw of a stage, can alter the direction of each measurement beam reflected from the plane mirrors. If left uncompensated, the altered measurement beams reduce the overlap of the exit measurement and reference beams in each corresponding interferometer. Furthermore, these exit measurement and reference beams will not be propagating parallel to one another nor will their wave fronts be aligned when forming the mixed beam. As a result, the interference between the exit measurement and reference beams will vary across the transverse profile of the mixed beam, thereby corrupting the interference information encoded in the optical intensity measured by the detector.

To address this problem, many conventional interferometers include a retroreflector that redirects the measurement beam back to the plane mirror so that the measurement beam "double passes" the path between the interferometer and the measurement object. The presence of the retroreflector insures that the direction of the exit measurement is insensitive to changes in the angular orientation of the measurement object. When implemented in a plane mirror interferometer, the configuration results in what is commonly referred to as a high-stability plane mirror interferometer (HSPMI). However, even with the retroreflector, the lateral position of the exit measurement beam remains sensitive to changes in the angular orientation of the measurement object. Furthermore, the path of the measurement beam through optics within the interferometer also remains sensitive to changes in the angular orientation of the measurement object.

In practice, the interferometry systems are used to measure the position of the wafer stage along multiple measurement axes. For example, defining a Cartesian coordinate system in which the wafer stage lies in the x-y plane, measurements are typically made of the x and y positions of the stage as well as the angular orientation of the stage with respect to the z axis, as the wafer stage is translated along the x-y plane. Furthermore, it may be desirable to also monitor tilts of the wafer stage out of the x-y plane. For example, accurate characterization of such tilts may be necessary to calculate Abbe offset errors in the x and y positions. Thus, depending on the desired application, there may be up to five degrees of freedom to be measured. Moreover, in some applications, it is desirable to also monitor the position of the stage with respect to the z-axis, resulting in a sixth degree of freedom.

To measure each degree of freedom, an interferometer is used to monitor distance changes along a corresponding metrology axis. For example, in systems that measure the x and y positions of the stage as well as the angular orientation of the stage with respect to the x, y, and z axes, at least three spatially separated measurement beams reflect from one side of the wafer stage and at least two spatially separated measurement beams reflect from another side of the wafer stage. See, e.g., U.S. Pat. No. 5,801,832 entitled "Method of and Device for Repetitively Imaging a Mask Pattern on a Substrate Using Five Measuring Axes," the contents of which are incorporated herein by reference. Each measurement beam is recombined with a reference beam to monitor optical path length changes along the corresponding metrology axes. Because the different measurement beams contact the wafer stage at different locations, the angular orientation of the wafer stage can then be derived from appropriate combinations of the optical path length measurements. Accordingly, for each degree of freedom to be monitored, the system includes at least one measurement beam that contacts the wafer stage. Furthermore, as described above, each measurement beam may double-pass the wafer stage to prevent changes in the angular orientation of the wafer stage from corrupting the interferometric signal. The measurement beams may be generated from physically separate interferometers or from multi-axes interferometers that generate multiple measurement beams.

The present invention also relates to monitoring the position of a reticle stage relative to a stable reference, for example, the projection optics column of a semiconductor lithography machine. A 2-frequency laser beam is split into a measurement beam and a reference beam, then recombined. The resulting interference is processed into a measurement signal. Typically, the reticle stage in this system has a large Yaw rotation. As described above, in a traditional interferometer the superposition of the measurement beam will shear on the reference beam.

For example, in some lithography machines the plane of the measurement axes and the plane of the reference axes are separated by many centimeters. In such situations, the conventional configuration of a "Column Reference" interferometer uses a polarizing beam splitter with a fold mirror on one side to make the measurement beam and the reference beam parallel. The distance of the fold mirror from the polarizing beam-splitting surface becomes problematic in this device. The coefficient of thermal expansion, CTE, of specialized materials like Zerodur® and Corning ULE® still contribute unacceptable errors of nanometers/° C., related to the thermal coefficient of the interferometer.

SUMMARY

In one aspect, the invention features an athermal zero-shear plane mirror interferometer configured to reduce or eliminate lateral shear between the measurement and reference beams caused, for example, by a change in the orientation of the measurement object (e.g., a reticle stage). Furthermore, embodiments include an athermal column reference configuration that is insensitive to measurement errors associated with the thermal growth of the path between the plane of the measurement axes and the plane of the reference axes. Moreover, the optical configuration reduces polarization related cyclic errors through the use of multiple polarizing beam-splitting surfaces along the optical path between the initial polarization beam splitter and the analyzer.

In another aspect, the invention features an interferometric apparatus that includes a first beam-splitting surface and a first set of optics. The first beam-splitting surface is positioned to separate an input beam into a first beam and a second beam. The first set of optics is positioned to receive the first beam, direct it to contact a first reflector multiple times and produce a first intermediate beam, where the first intermediate beam follows a nominal output path when the first reflector has a first alignment normal to the first beam prior to reflection by the first reflector. The first set of optics includes a second beam-splitting surface, a third beam-splitting surface, and a first fold optic that are positioned to reduce displacement of the first intermediate beam from the nominal output path when the first reflector has an alignment different from the first alignment.

Implementations of the invention may include one or more of the following features.

The first beam-splitting surface is further positioned to combine the first intermediate beam with a second intermediate beam derived from the second beam to produce an overlapping pair of output beams.

The interferometric apparatus includes a second beam-splitting surface positioned to combine the first intermediate beam with a second intermediate beam derived from the second beam to produce an overlapping pair of output beams.

The interferometric apparatus includes a steering wedge positioned to adjust a propagation direction of the first intermediate beam to increase an overlap between the overlapping pair of output beams.

The interferometric apparatus includes a second set of optics positioned to receive the second beam, direct it to contact a second reflector multiple times and produce a second intermediate beam, the second intermediate beam following the nominal output path when the second reflector has a first alignment normal to the second beam prior to reflection by the second reflector.

The second set of optics includes a fourth beam-splitting surface, a fifth beam-splitting surface, and a second fold optic positioned to reduce displacement of the second intermediate beam from the nominal output path when the second reflector has an alignment different from the second alignment.

The fourth beam-splitting surface is parallel to the second beam-splitting surface, and the fifth beam-splitting surface is parallel to the third beam-splitting surface.

The second and third beam-splitting surfaces include polarizing beam-splitting surfaces.

The first beam-splitting surface includes a polarizing beam-splitting surface.

The first set of optics is positioned to cause the first intermediate beam to follow the nominal output path when the first reflecting element has a second alignment different from the first alignment.

The second and third beam-splitting surfaces are perpendicular to each other.

The first fold optic includes a first reflecting surface and a second reflecting surface that are perpendicular to each other.

The second and third beam-splitting surfaces intersect at a first line, the first and second reflecting surfaces intersect at a second line, the first line being perpendicular to the second line.

The second and third beam-splitting surfaces and reflecting surfaces of the first fold optic are positioned so that when the first beam contacts any of the surfaces, the first beam has a polarization direction parallel to the surface.

When the first reflector has the first alignment and the first beam is reflected by a surface in the first set of optics, the incident angle of the first beam relative to the surface is substantially equal to 45°.

In another aspect, the invention features an interferometric apparatus that includes a beam separating device and a first set of optics. The beam separating device separates an input beam into a first beam and a second beam. The first set of optics includes a first beam-splitting surface and a second beam-splitting surface. The first set of optics receives the first beam and directs the first beam along multiple passes that pass through a portion of the first set of optics. In each pass, the first beam propagates towards the first reflector and is reflected by the first reflector. The multiple passes include a first set of passes and a second set of passes. The first reflector has a first alignment that is normal to the propagation direction of the first beam prior to reflection by the first reflector. The first beam follows a first nominal beam path when the first reflector has the first alignment, the path of the first beam being sheared relative to the first nominal beam path during the first set of passes and during the second set of passes if the first reflector has an alignment other than the first alignment. The first set of optics includes a first fold optic to redirect the first beam after the first set of passes and before the second set of passes so that shear imparted during the second set of passes reduces or cancels shear imparted during the first set of passes.

Implementations of the invention may include one or more of the following features.

The first and second beam-splitting surfaces reflect the first beam between the first and second passes and between the third and fourth passes The apparatus includes a second set of optics to receive the second beam and direct the second beam along multiple passes through a portion of the second set of optics, the second set of optics including a third beam-splitting surface and a fourth beam-splitting surface. The multiple passes through the second set of optics includes a third set of passes and a fourth set of passes. The second reflector has a second alignment that is normal to the propagation direction of a portion of the second beam that is reflected by the second reflector, the path of the second beam being sheared during the third set of passes and during the fourth set of passes through the second set of optics if the second reflector has an alignment other than the second alignment. The second set of optics includes a second fold optic to redirect the second beam after the third set of passes and before the fourth set of passes so that shear imparted during the fourth set of passes reduces or cancels shear imparted during the third set of passes.

The apparatus includes a beam combining device to combine the first beam and the second beam into an overlapping pair of output beams after the first beam completes the first and second set of passes and the second beam completes the third and fourth set of passes.

During the first set of passes, the first beam passes through the first beam-splitting surface, is reflected in sequence by the first reflector, the first beam-splitting surface, the second beam-splitting surface, and the first reflector, then passes through the second beam-splitting surface.

In another aspect, the invention features a multiple-pass interferometer that includes a first set of optics in cooperation with a measurement mirror to direct a measurement beam along a measurement path that passes through a portion of the first set of optics multiple times to produce a first intermediate beam. The interferometer includes a second set of optics in cooperation with a reference mirror to direct a reference beam along a reference path that passes through a portion of the second set of optics multiple times to produce a second intermediate beam. The interferometer includes a combining optical element to combine the first and second intermediate beams to form an overlapping pair of output beams. The first and second set of optics each has at least two reflecting surfaces and at least one beam-splitting surface positioned to reduce relative beam shear between the first and second intermediate beams caused by either the measurement mirror being at an angle relative to a first predefined position and/or the reference mirror being at an angle relative to a second predefined position.

Implementations of the invention may include one or more of the following features.

The beam-splitting surface in each of the first and second sets of optics includes a polarizing beam-splitting surface.

The first set of optics includes a first beam-splitting surface and a second beam-splitting surface.

The first and second beam-splitting surfaces are perpendicular to each other.

The second set of optics includes a third beam-splitting surface and a fourth beam-splitting surface, the third beam-splitting surface being parallel to the first beam-splitting surface, and the fourth beam-splitting surface being parallel to the second beam-splitting surface.

The first set of optics includes at least one corner cube retroreflector that in cooperation with the beam-splitting surface and the measurement mirror directs the measurement beam along the measurement path.

The measurement path passes through a portion of the first set of optics in at least a first set of passes and a second set of passes, the at least two reflecting surfaces and at least one beam-splitting surface of the first set of optics are positioned so that shear imparted to the measurement path during the first set of passes is compensated by shear imparted to the measurement path during the second set of passes when the measurement mirror is at an angle relative to the first predefined position.

In another aspect, the invention features a method that includes separating an input beam into a first beam and a second beam, and directing the first beam through a first set of optics to contact a first reflector multiple times to produce a first intermediate beam. The first intermediate beam follows a nominal output path when the first reflector has a first alignment normal to the first beam prior to reflection by the first reflector. The first set of optics includes a first pair of beam-splitting surfaces and a first fold optic positioned to reduce displacement of the first intermediate beam from the nominal output path when the first reflector has an alignment different from the first alignment.

Implementations of the invention may include one or more of the following features.

The method includes combining the first intermediate beam with a second intermediate beam derived from the second beam to produce an overlapping pair of output beams.

The method includes directing the second beam through a second set of optics to contact a second reflector multiple times to produce a second intermediate beam, the second intermediate beam following the nominal output path when the second reflector has a first alignment normal to the second beam prior to reflection by the second reflector. The second set of optics includes a second pair of beam-splitting surfaces and a second fold optic positioned to reduce displacement of the second intermediate beam from the nominal output path when the second reflector has an alignment different from the second alignment.

In another aspect, the invention features a method that includes assembling a first beam-splitting surface, a first set of optics, and a beam-combining surface to form an interferometer. The first beam-splitting surface during operation of the interferometer separates an input beam into a measurement beam and a reference beam. The first set of optics includes a first pair of beam-splitting surfaces and a first fold optic that are positioned to direct the measurement beam to contact a measurement mirror multiple times to form a first intermediate beam. The first intermediate beam follows a nominal output path when the measurement mirror has a normal alignment. The first pair of beam-splitting surfaces and the first fold optic are positioned to reduce displacement of the first intermediate beam from the nominal output path when the first reflector has an alignment different from the normal alignment. The beam-combining surface is positioned to combine the first intermediate beam with a second intermediate beam derived from the reference beam to form an overlapping pair of output beams.

Implementations of the invention may include one or more of the following features.

The method includes assembling a second set optics with the first beam-splitting surface, the first set of optics, and the beam-combining surface to form the interferometer. The second set of optics includes a second pair of beam-splitting surfaces and a second fold optic positioned to direct the reference beam to contact a reference mirror multiple times to form the second intermediate beam. The second intermediate beam follows a nominal output path when the reference mirror has a normal alignment. The second pair of beam-splitting surfaces and the second fold optic positioned to reduce displacement of the second intermediate beam from the nominal output path when the second reflector has an alignment different from the normal alignment.

Assembling the first beam-splitting surface, the first set of optics, and the beam-combining surface to form the interferometer includes positioning the first pair of beam-splitting surfaces so that they are perpendicular to each other and intersect at a first line, positioning the first pair of reflecting surfaces so that they are perpendicular to each other and intersect at a second line, where the first line is perpendicular to the second line.

In another aspect, the invention features a method that includes separating an input beam into a first beam and a second beam, and directing the first beam along multiple passes that pass through a portion of a first set of optics. In each pass, the first beam propagates towards a first reflector and is reflected by the first reflector. The first set of optics includes a first beam-splitting surface and a second beam-splitting surface that reflect the first beam multiple times. The multiple passes include a first set of passes and a second set of passes. The first reflector has a first alignment that is normal to the propagation direction of the first beam prior to reflection by the first reflector. The first beam follows a first nominal beam path when the first reflector has the first alignment. The path of the first beam is sheared relative to the first nominal beam path during the first set of passes and during the second set of passes if the first reflector has an alignment other than the first alignment. The method includes redirecting the first beam after the first set of passes and before the second set of passes so that shear imparted during the second set of passes reduces or cancels shear imparted during the first set of passes.

Implementations of the invention may include one or more of the following features.

The method includes directing the second beam along multiple passes through a portion of a second set of optics. The second set of optics includes a third beam-splitting surface and a fourth beam-splitting surface that reflect the second beam multiple times. The multiple passes through the second set of optics include a third set of passes and a fourth set of passes. The second reflector has a second alignment that is normal to the propagation direction of a portion of the second beam that is reflected by the second reflector. The path of the second beam is sheared during the third set of passes and during the fourth set of passes through the second set of optics if the second reflector has an alignment other than the second alignment. The method includes redirecting the second beam after the third set of passes and before the fourth set of passes so that shear imparted during the fourth set of passes reduces or cancels shear imparted during the third set of passes.

The method includes combining the first beam and the second beam into an overlapping pair of output beams after the first beam completes the first and second set of passes and the second beam completes the third and fourth set of passes.

In another aspect, the invention features a method that includes separating an input beam into a measurement beam and a reference beam, and directing the measurement beam to pass through a first beam-splitting surface. The measurement beam is reflected in sequence by a measurement mirror, the first beam-splitting surface, a second beam-splitting surface, and the measurement mirror (a second time). The measurement beam is directed to pass through the second beam-splitting surface, and later combined with the reference beam to form an overlapping pair of output beams.

Implementations of the invention may include one or more of the following features.

The method includes redirecting the measurement beam using a fold optic so that the measurement beam passes through the second beam-splitting surface a second time, and is reflected in sequence by the measurement mirror (a third time), the second beam-splitting surface, the first beam-splitting surface, and the measurement mirror (a fourth time).

In another aspect, the invention features a method that includes directing a measurement beam along a measurement path that passes through a first set of optics and contacts a measurement mirror multiple times to produce a first intermediate beam, the measurement beam passing through a portion of the first set of optics multiple times. The method includes directing a reference beam along a reference path that passes through a second set of optics and contacts a reference mirror multiple times to produce a second intermediate beam, the reference beam passing through a portion of the second set of optics multiple times. The method includes combining the first and second intermediate beams to form an overlapping pair of output beams. The first and second set of optics each has at least two reflecting surfaces and at least one beam-splitting surface positioned to reduce relative beam shear between the first and second intermediate beams caused by either the measurement mirror being at an angle relative to a first predefined position and/or the reference mirror being at an angle relative to a second predefined position.

Implementations of the invention may include one or more of the following features.

The method includes directing the measurement beam to pass through a portion of the first set of optics in at least a first set of passes and a second set of passes, and positioning the at least two reflecting surfaces and at least one beam-splitting surface of the first set of optics so that shear imparted to the measurement path during the first set of passes is compensated by shear imparted to the measurement path during the second set of passes when the measurement mirror is at an angle relative to the first predefined position.

In another aspect, the invention features a lithography system for use in fabricating integrated circuits on a wafer. The system includes a stage for supporting the wafer, an illumination system for imaging spatially patterned radiation onto the wafer, a positioning system for adjusting the position of the stage relative to the imaged radiation, and one or more of the interferometric apparatuses described above for monitoring the position of the wafer relative to the imaged radiation.

In another aspect, the invention features a lithography system for use in fabricating integrated circuits on a wafer. The system includes a stage for supporting the wafer, and an illumination system that includes a radiation source, a mask, a positioning system, a lens assembly, and one or more of the interferometric apparatuses described above. During operation of the lithography system, the source directs radiation through the mask to produce spatially patterned radiation, the positioning system adjusts the position of the mask relative to the radiation from the source, the lens assembly images the spatially patterned radiation onto the wafer, and the one or more interferometric apparatuses monitor the position of the mask relative to the radiation from the source.

In another aspect, the invention features a beam writing system for use in fabricating a lithography mask. The system includes a source to provide a write beam to pattern a substrate, a stage supporting the substrate, a beam directing assembly for delivering the write beam to the substrate, a positioning system for positioning the stage and beam directing assembly relative one another, and one or more of the interferometric apparatuses described above for monitoring the position of the stage relative to the beam directing assembly.

In another aspect, the invention features a lithography method for use in fabricating integrated circuits on a wafer. The method includes supporting the wafer on a moveable stage, imaging spatially patterned radiation onto the wafer, adjusting the position of the stage, and monitoring the position of the stage using any of the interferometric methods described above.

In another aspect, the invention features a lithography method for use in the fabrication of integrated circuits. The method includes directing input radiation through a mask to produce spatially patterned radiation, positioning the mask relative to the input radiation, monitoring the position of the mask relative to the input radiation using any of the interferometric methods described above, and imaging the spatially patterned radiation onto a wafer.

In another aspect, the invention features a lithography method for fabricating integrated circuits on a wafer. The method includes positioning a first component of a lithography system relative to a second component of a lithography system to expose the wafer to spatially patterned radiation, and monitoring the position of the first component relative to the second component using any of the interferometric methods described above.

In another aspect, the invention features a method for fabricating integrated circuits that includes any of the lithography methods described above.

In another aspect, the invention features a method for fabricating integrated circuits that includes using any of the lithography apparatuses described above.

In another aspect, the invention features a method for fabricating a lithography mask. The method includes directing a write beam to a substrate to pattern the substrate, positioning the substrate relative to the write beam, and monitoring the position of the substrate relative to the write beam using any of the interferometry methods described above.

Unless otherwise defined, all technical and scientific terms used herein have the same meaning as commonly understood by one of ordinary skill in the art to which this invention belongs. In case of conflict with publications, patent applications, patents, and other references mentioned incorporated herein by reference, the present specification, including definitions, will control.

The details of one or more embodiments of the invention are set forth in the accompanying drawings and the description below. Other features, objects, and advantages of the invention will be apparent from the following detailed description.

DESCRIPTION OF DRAWINGS

FIGS. 1, 4, 5, and 14 are schematic diagrams of interferometers.

FIGS. 6 and 7 show configurations of reflectors used in the interferometer of FIG. 5.

DETAILED DESCRIPTION

Figure 1:
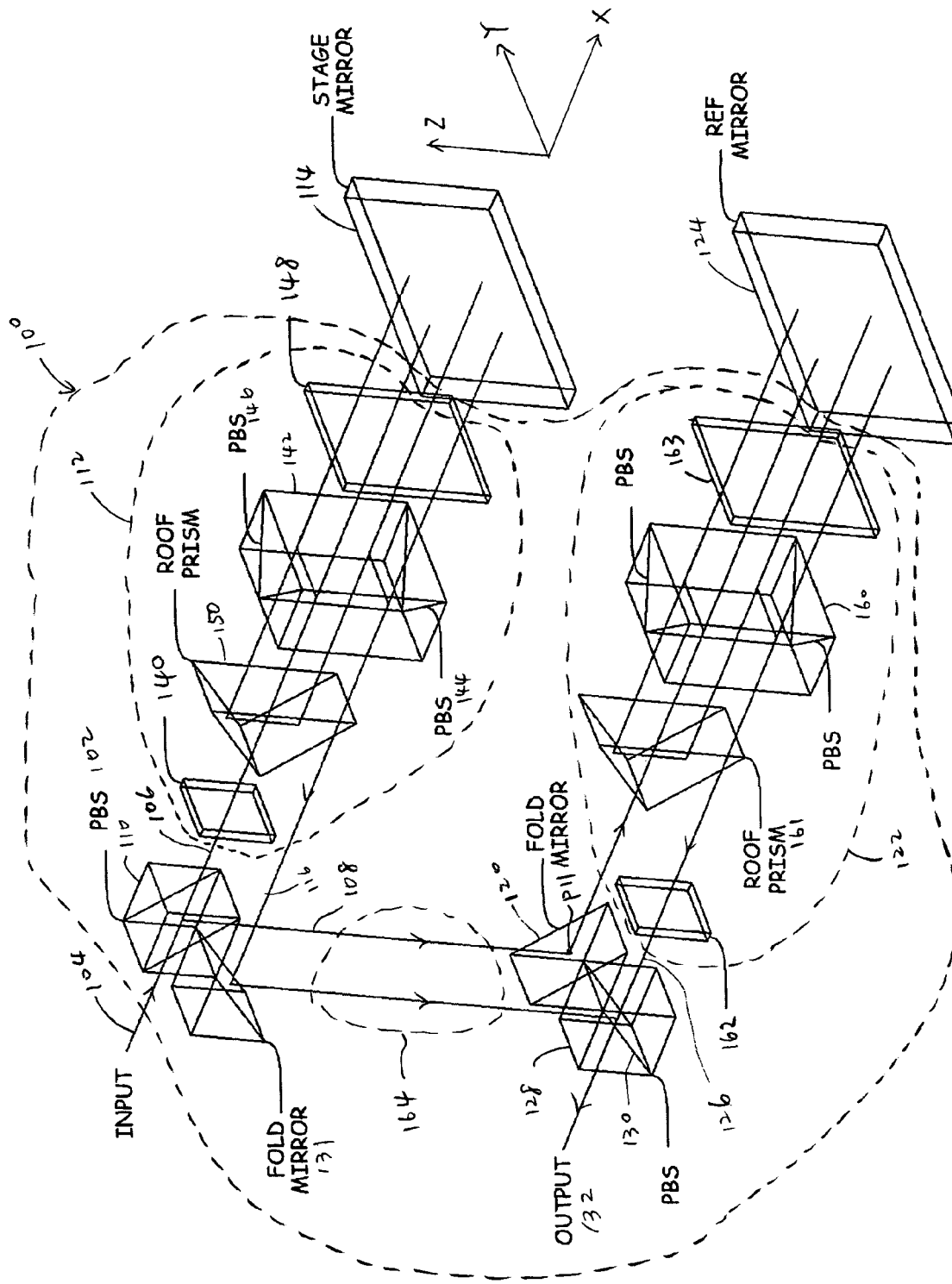

Referring to FIG. 1, an interferometer 100 includes a first set of optics 112 and a second set of optics 122 designed so that relative movements of a stage mirror 114 and a reference mirror 124 can be accurately measured despite imperfect alignment of mirror 114 and/or mirror 124. An input beam 104 is separated into a measurement beam 106 and a reference beam 108 by a polarizing beam-splitting surface (PBS) 102 of a polarizing beam-splitting cube 110. Measurement beam 106 and reference beam 108 have orthogonal polarizations and orthogonal propagation directions. Measurement beam 106 is directed to contact stage mirror 114 four times before forming an intermediate beam 116. Reference beam 108 is directed to contact reference mirror 124 four times before forming an intermediate beam 126. Intermediate beams 116 and 126 are combined to form an overlapping pair of output beams 132. The interference pattern of the overlapping output beams is analyzed to determine changes in the position of stage mirror 114 relative to reference mirror 124.

The first set of optics 112 is positioned to receive beam 106 and direct the beam to contact stage mirror 114 four times to produce intermediate beam 116. The first set of optics 112 includes a half wave retarder 140, a roof prism 150, a dual PBS roof module 142, and a quarter wave retarder 148. Beam 116 is reflected by a fold mirror 131 towards a polarizing beam-splitting cube 128 having a PBS 130, which combines beam 116 with intermediate beam 126 to produce the overlapping pair of output beams 132.

Intermediate beam 116 follows a nominal beam path when stage mirror 114 has a normal alignment (which is defined as an alignment that is normal to the portion of the measurement beam 106 after passing PBS 102 and before contacting reflector 114). As described in more detail below, the first set of optics 112 is designed to reduce displacement of the intermediate beam 116 from the nominal beam path when the stage mirror 114 has an alignment different from the normal alignment.

Interferometer 100 includes a fold mirror 120 that directs reference beam 108 towards the second set of optics 122, which directs beam 108 to contact a reference mirror 124 four times to produce an intermediate beam 126. Similar to the first set of optics 112, the second set of optics 122 includes a half wave retarder 162, a roof prism 161, a dual PBS roof module 160, and a quarter wave retarder 163.

Intermediate beam 126 follows a nominal beam path when the reference mirror 124 has a normal alignment (which is defined as an alignment that is normal to the portion of reference beam 108 after it is reflected by fold mirror 120 and before contacting mirror 124). Similar to the first set of optics 112, the second set of optics 122 is designed to reduce displacement of the intermediate beam 126 from the nominal beam path when the reference mirror 124 has an alignment different from the normal alignment.

In one example, stage mirror 114 moves relative to interferometer 100 in a direction parallel to an X-axis. Such movement of stage mirror 114 changes the optical path length of measurement beam 106. Changes in the differences in optical path lengths of measurement and reference beams 106 and 108 are detected by analyzing the interference pattern of the output beams 132.

Figure 2:
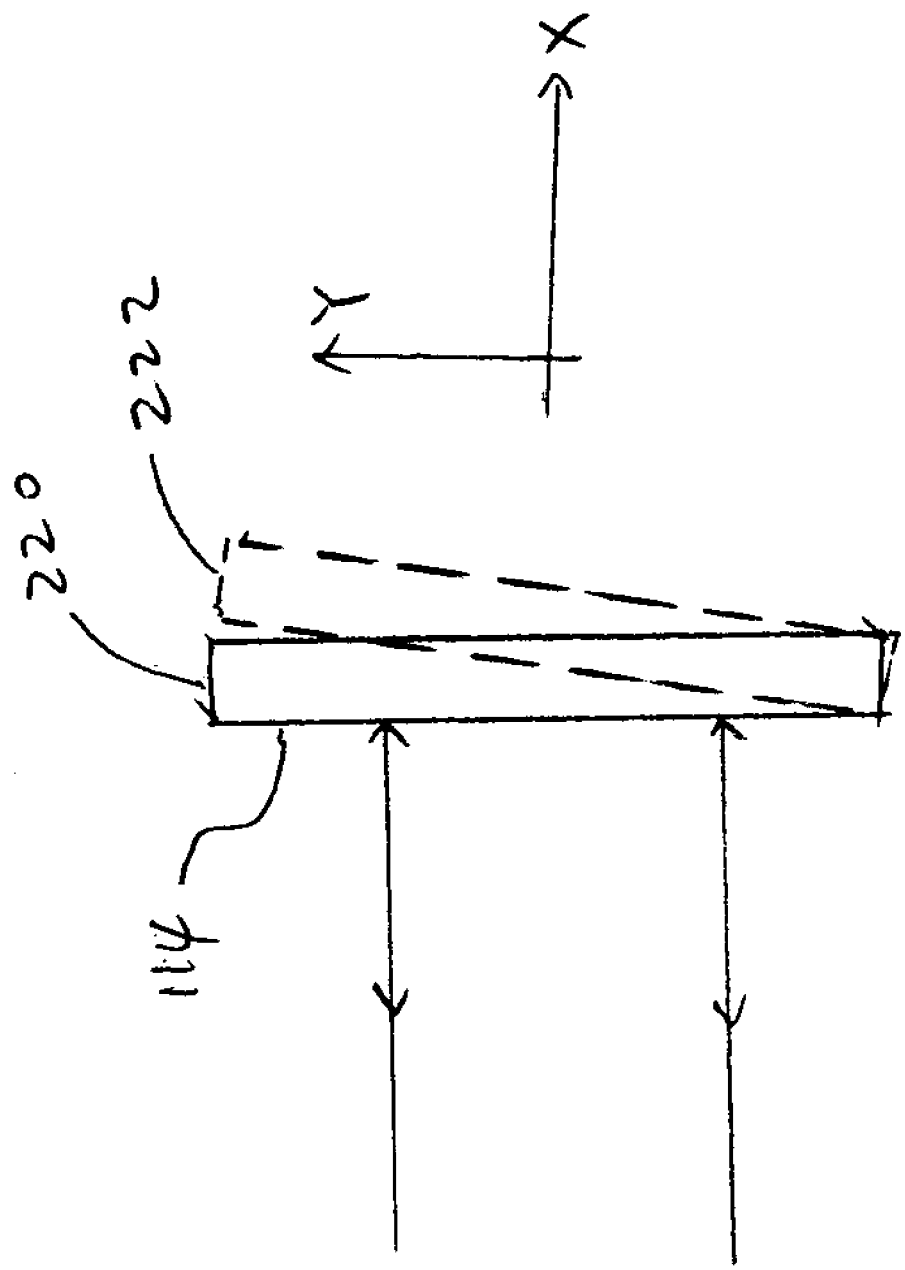
FIG. 2 shows positions of a measurement mirror.

In another example, stage mirror 114 moves relative to interferometer in a direction parallel to an Y-axis or an Z-axis. If stage mirror 114 originally has a normal alignment, and moves perfectly parallel to the Y-Z plane, there would be no change in the optical path length traveled by the measurement beam 106. However, referring to FIG. 2, when stage mirror 114 tilts by rotating about an axis that is not parallel to the X-axis, such as from a position 220 having a normal alignment to a position 222 having an alignment different from the normal alignment, such tilting of stage mirror 114 changes the optical path length of measurement beam 106 and may be detected by analyzing the output beams 132.

Reference mirror 124 may be a column reference that is supported at a fixed position relative to interferometer 100. Reference mirror 124 may also move relative to interferometer 100 independently of stage mirror 114.

The first and second set of optics 112 and 122 are designed to reduce the displacement of the measurement and reference beam components 116 and 126 from their respective nominal beam paths when either or both of the stage mirror 114 and reference mirror 124 have alignments that are different from the normal alignments (e.g., when mirror 114 moves to position 222). This reduces beam shear between the overlapping pair of output beams 132, thereby reducing non-cyclic non-linearity errors in the measurement of movement of stage mirror 114 relative to reference mirror 124.

The following describes in more detail the first and second set of optics 112 and 122. In the description of the four passes traversed by beam 106, the stage mirror 114 is assumed to have a normal alignment.

Figure 3:
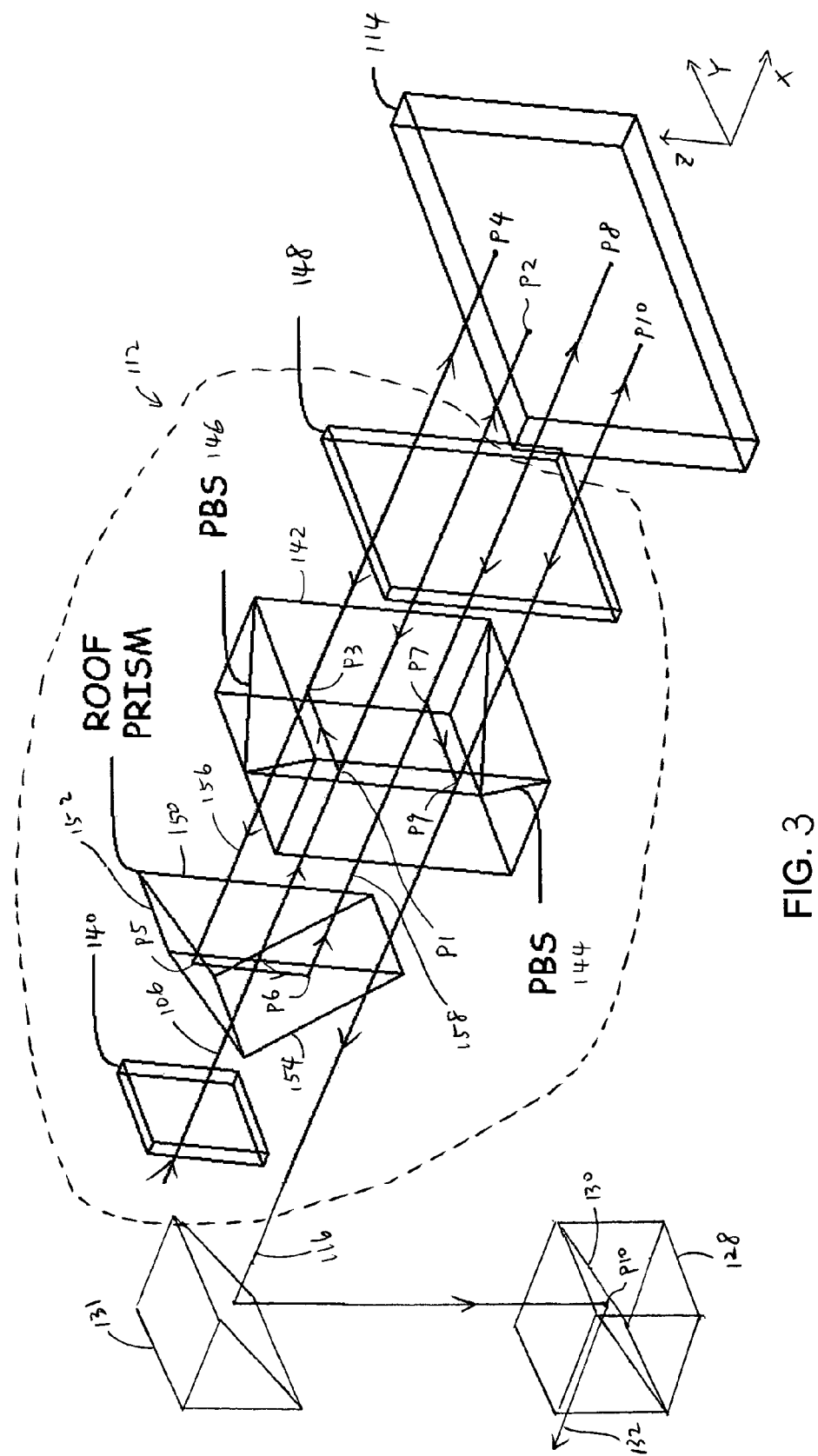
FIGS. 3, 12, and 13 are schematic diagrams of optical elements.

Referring to FIG. 3, the first set of optics 112 includes a half wave retarder 140 that rotates the state of polarization of beam 106 by $\pi/2$. A dual PBS roof module 142 and a roof prism 150 (or a hollow roof mirror) are used to direct beam 106 along four passes through a portion of the first set of optics 112. In each pass, beam 106 propagates towards reflector 114 and is reflected by the reflector. Roof module 142 has a PBS coating 144 and a PBS coating 146. Roof prism 150 has reflecting surfaces 152 and 154.

In the first pass, beam 106 propagates through the first PBS coating 144 at a point P1, passes through a quarter wave retarder 148, is reflected by stage mirror 114 at a point P2, and passes through quarter wave retarder 148 a second time, rotating the state of polarization by $\pi/2$. Beam 106 is then reflected by PBS coating 144 and PBS coating 146 at point P1 and a point P3, respectively.

In the second pass, beam 106 passes through quarter wave retarder 148 a third time, is reflected by stage mirror 114 at a point P4, passes through quarter wave retarder 148 a fourth time, rotating the state of polarization by another $\pi/2$, and passes through PBS coating 146 at point P3 to form an intermediate beam 156. To describe different portions of the measurement beam 106, the beam 106 may have a different reference number. For example, the portion of beam 106 after passing roof module 146 and before contacting reflecting surface 150 may be referred to as either the measurement beam 106 or the intermediate beam 156.

Intermediate beam 156 is similar to an output beam of a traditional two pass interferometer, which would have beam shear if the stage mirror 114 has an alignment different from the normal alignment. Intermediate beam 156 is reflected by reflecting surfaces 152 and 154 of roof prism 150 at points P5 and P6, respectively, to form an intermediate beam 158. Intermediate beam 158 travels a third pass and a fourth pass along a path that is reverse of the path traveled by beam 106 in the first and second passes, but along a plane parallel to and spatially separated from the plane traveled by beam 106 during the first and second passes.

In the third pass, beam 106 passes through PBS coating 146 at a point P7, passes through quarter wave retarder 148 a fifth time, is reflected by stage mirror 114 at a point P8, and passes quarter wave retarder 148 a sixth time, rotating the state of polarization by another $\pi/2$. Beam 106 is then reflected by PBS coatings 146 and PBS coating 144 at point P7 and a point P9, respectively.

In the fourth pass, beam 106 passes through quarter wave retarder 148 a seventh time, is reflected by reflector 114 at a point P10, and passes quarter wave retarder 148 an eighth time, rotating the state of polarization by another $\pi/2$. Beam 106 then passes through PBS coating 144 at point P9 and subsequently exits the first set of optics 112 to form beam 116.

After exiting the first set of optics 112, beam 116 is reflected by fold mirror 131 and directed along a path parallel to the portion of beam 108 after being reflected by PBS 102. Beam 116 is reflected by PBS 130 at point P10 to form one of the output beams 132.

Beam 106 travels along a nominal beam path when stage mirror 114 has a normal alignment. In the first and second passes, when mirror 114 has an alignment different from the normal alignment, beam 106 travels along a beam path that deviates from the nominal beam path, causing beam shear. In the third and fourth passes, beam 106 experiences the same manipulations by the first set of optics 112 as it did on the first two passes in a reverse order. Regardless of the magnitude and direction of shear (between actual measurement beam path and the nominal beam path) due to a tilt in the stage mirror 114, the shear imparted to measurement beam 106 during the first and second passes will be reduced (or canceled) by shear imparted to measurement beam 106 during the third and fourth passes. Thus, after four passes, beam 106 exits the dual PBS roof module 142 with reduced (or zero) shear relative to the nominal beam path.

The first set of optics 112 is designed so that when beam 106 is reflected by any reflecting surface in the first set of optics 112, the polarization direction of beam 106 is parallel to the reflecting surface. For example, when beam 106 passed through half wave retarder 140, beam 106 has a polarization direction that is parallel to the Y-direction. In the first pass, after passing through quarter wave retarder 148 twice, the polarization direction of beam 106 becomes parallel to the Z-direction, which is parallel to surfaces 144 and 146. Such design of the first set of optics 112 helps preserve the state of polarization of beam 106.

Referring again to FIG. 1, the reference beam 108, after being separated from the measurement beam 106 by PBS 102, is reflected by fold mirror 120 at a point P11 and directed towards the second set of optics 122. Beam 108 is in a state of polarization that will pass through a dual PBS roof module 160 of the second set of optics 122. Beam 108 travels along four passes through a portion of the second set of optics 122 in a manner similar to the way beam 106 travels along four passes through a portion of the first set of optics 112. After the fourth pass, beam 108 passes through a half wave retarder 162 and exits the second set of optics 122 to form an intermediate beam 126. Beam 126 then passes through PBS 130 to form one of the overlapping pair of output beams 132.

Beam 108 travels along a nominal beam path when reference mirror 124 has a normal alignment. In the first and second passes, when mirror 124 has an alignment different from the normal alignment, beam 108 travels along a beam path that deviates from the nominal beam path, causing beam shear. In the third and fourth passes, beam 108 experiences the same manipulations by the second set of optics 122 as it did on the first two passes in a reverse order. Shear imparted to beam 108 during the first and second passes is offset by shear imparted to beam 108 during the third and fourth passes. Thus, after four passes, beam 108 exits the dual PBS roof module 160 with reduced (or zero) shear relative to the nominal beam path.

By directing the measurement beam 106 and reference beam 108 along four passes through portions of the first and second sets of optics 112 and 122, respectively, the relative beam shear between the overlapping pair of output beams 132 is reduced when either or both of the stage mirror 114 and reference mirror 124 have alignments that are different from the normal alignments. By having reduced relative beam shear, an input beam having a smaller diameter can be used.

Similar to the first set of optics 112, the second set of optics 122 is designed so that when beam 108 is reflected by any reflecting surface in the second set of optics 122, the polarization direction of beam 108 is parallel to the reflecting surface. This helps preserve the state of polarization of beam 108.

Interferometer 100 is designed so that the optical path lengths of measurement beam 106 and reference beam 108 within optical components are substantially the same. The optical components in the first set of optics 112 are substantially the same as the optical components in the second set of optics 122. This design allows interferometer 100 to be insensitive to changes in temperature, since the optical components in the first and second set of optics 112 and 122 are subject to substantially the same amount of change caused by variances in temperature. Because the first and second set of optics 112 and 122 have substantially the same configuration (except for the placement of half wave retarders 140 and 162), the mechanical structure supporting the first and second set of optics 112 and 122 can be substantially the same, and be subject to the same amount of changes due to temperature variances. This allows the use of inexpensive materials (e.g., metals, glass, composites) for the mechanical support structure.

Both measurement beam 106 and reference beam 108 travel the same distance over a region 164 between cube 110 and fold mirror 120 (or between fold mirror 131 and cube 128). This allows stage mirror 114 and reference mirror 124 to have a large separation and still be insensitive to temperature changes because beams 106 and 108 are subject to substantially the same changes in optical path lengths due to changes in the refractive index of air in region 164.

Interferometer 100 includes multiple polarizing beam-splitting surfaces that cleanse polarization leakage along optical paths of the measurement and reference beams 106 and 108, thereby reducing cyclic errors. For example, suppose beam 106, after passing through PBS 102, is mainly polarized in the Z-direction, but also has a small component that is polarized in the Y-direction (this may be caused by an incomplete separation of orthogonal components of input beam 104). When beam 106 passes half wave retarder 140 and reaches PBS coating 144, beam 106 will mainly be polarized in the Y-direction, and will have a small component polarized in the Z-direction. The component polarized in the Z-direction will be reflected by PBS coating 144, and will not become part of output beams 132. If a small portion of the component polarized in the Z-direction passes through PBS coating 144, this component will be diverted from the measurement beam path by subsequent polarization beam-splitting surfaces.

A feature of interferometer 100 is that it does not include any corner cube retroreflector, thus eliminating problems associated with usage of corner cube retroreflectors (e.g., polarization rotation).

The optical elements in interferometer 100 may contain impurities or be misaligned so that the overlapping output beams 132 do not completely overlap. This reduces signal efficiency, as only a portion of the light beams form interference patterns that can be measured. To remedy this, one or more steering wedges can be inserted in region 164 to adjust the propagation direction of either or both of beams 116 and 108 to increase the overlap of output beams 132, thereby increasing signal efficiency.

Figure 4:
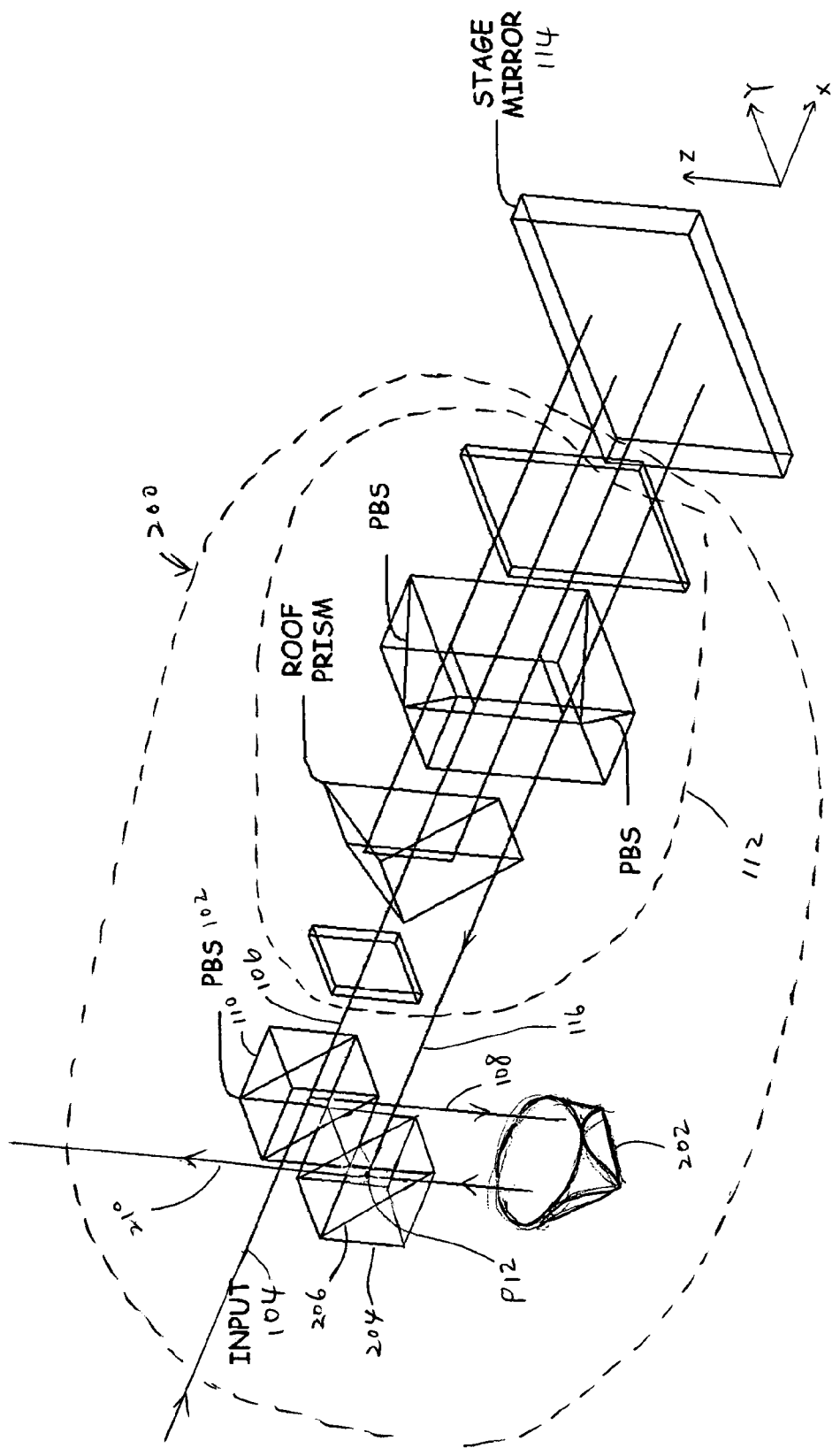

Referring to FIG. 4, an interferometer 200 uses a set of optics 112 to reduce beam shear caused by stage mirror 114 having an alignment different from the normal alignment. Similar to interferometer 100, interferometer 200 directs a measurement beam 106 along four passes through the set of optics 112 to contact a stage mirror 114 four times. As described above, the set of optics 112 is designed to reduce displacement of the intermediate beam 116 from a nominal beam path when the stage mirror 114 has an alignment different from the normal alignment.

Instead of using a fold mirror to reflect beam 116 (as in interferometer 100), beam 116 is directed towards a PBS 206 and reflected by PBS 206 at a point P12 to form a measurement beam component of an overlapping pair of output beams 210. A corner cube retroreflector 202 is used to redirect the reference beam 108 towards PBS 206. Beam 108 passes PBS 206 at point P12 to form a reference beam component of the overlapping pair of output beams 210. The position of retroreflector 202 can either be fixed or be movable relative to the set of optics 112.

Referring to FIG. 5, an interferometer 300 includes a first set of optics 302 and a second set of optics 304 that reduce relative beam shear between a measurement component and a reference beam component of an overlapping pair of output beams 308 when either one or both of a stage mirror 114 and a reference mirror 124 have alignments that are different from their respective normal alignments.

Interferometer 300 includes a polarizing beam-splitting cube 310 having a PBS 312 that separates an input beam 104 into a measurement beam 106 and a reference beam 108 that have orthogonal polarizations and orthogonal propagation directions. The first set of optics 302 is positioned to receive the measurement beam 106, direct beam 106 to contact stage mirror 114 four times, and produce an intermediate beam 306. The first set of optics 302 is designed to reduce displacement of the intermediate beam 306 from a nominal beam path (which is traversed by beam 106 when mirror 114 has a normal alignment) when the stage mirror 114 has an alignment different from the normal alignment.

The first set of optics 302 includes a polarizing beam-splitting cube 310 that has a PBS 312. Beam 106 travels along four passes through a portion of the first set of optics 302. A quarter wave retarder 314 is used to rotate the polarization of beam 106 by $\pi/2$ as beam 106 passes quarter wave retarder 314 twice in each pass. Corner cube retroreflectors 318 and 320 redirect beam 106 along parallel but opposite directions. During the first and second passes, beam 106 travels through a portion of cube 310, quarter wave retarder 314, and retroreflector 318, after which beam 106 exits cube 310 to form an intermediate beam 316.

Beam 316 is directed by three reflecting surfaces 322, 324, and 326 to form a second intermediate beam 328, which travels in a direction parallel but opposite to beam 316.

Referring to FIG. 6, reflecting surfaces 322, 324, and 326 are positioned so that the sum of angles $\alpha$, $\beta$, and $\gamma$ (which represent angles between incident and reflection beams at mirrors 322, 324, and 326, respectively) are zero. Angle $\alpha$ has a negative value (representing a clockwise rotation from beam 316 to a beam 330), angle $\beta$ has a positive value (representing a counter clockwise rotation from beam 330 to beam 332), and angle $\gamma$ has a positive value.

Referring to FIG. 7, reflecting surfaces 322, 324, and 326 can also be arranged so that $\alpha+\beta+\gamma=360°$. In general, multiple reflecting surfaces can be used as long as the sum of the angles formed between incident and reflecting beams is equal to zero or multiples of 360°.

Intermediate beam 328 enters cube 310, travels along the third and fourth passes through a portion of cube 310, quarter wave retarder 314, and retroreflector 320, after which beam 328 exits cube 310 to form the intermediate beam 306. Beam 306 is reflected by a fold mirror 338, passes through a half wave retarder 336, and propagates towards a polarizing beam-splitting cube 334.

Reference beam 108, after being separated from measurement beam 106, passes through half wave retarder 336 and is reflected by a fold mirror 330. Beam 108 then travels through the second set of optics 304 along four passes and contacts reference mirror 124 four times before exiting the second set of optics 304 to form an intermediate beam 332. Intermediate beams 306 and 332 are combined by a polarizing beam-splitting cube 334 to form an overlapping pair of output beams 308.

An interferometry system may include the interferometers described above and its variants. For example, an interferometry system may include additional linear and angular displacement interferometers to measure three or more degrees of freedom wherein the output beams of the additional interferometers may have zero or reduced differential beam shear at respective detectors.

The interferometry systems described above provide highly accurate measurements. Such systems can be especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see for example the *Semiconductor Industry Roadmap*, p82 (1997).

Overlay depends directly on the performance, i.e. accuracy and precision, of the distance measuring interferometers used to position the wafer and reticle (or mask) stages. Since a lithography tool may produce $50–100 M/year of product, the economic value from improved performance distance measuring interferometers is substantial. Each 1% increase in yield of the lithography tool results in approximately $1 M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 8:
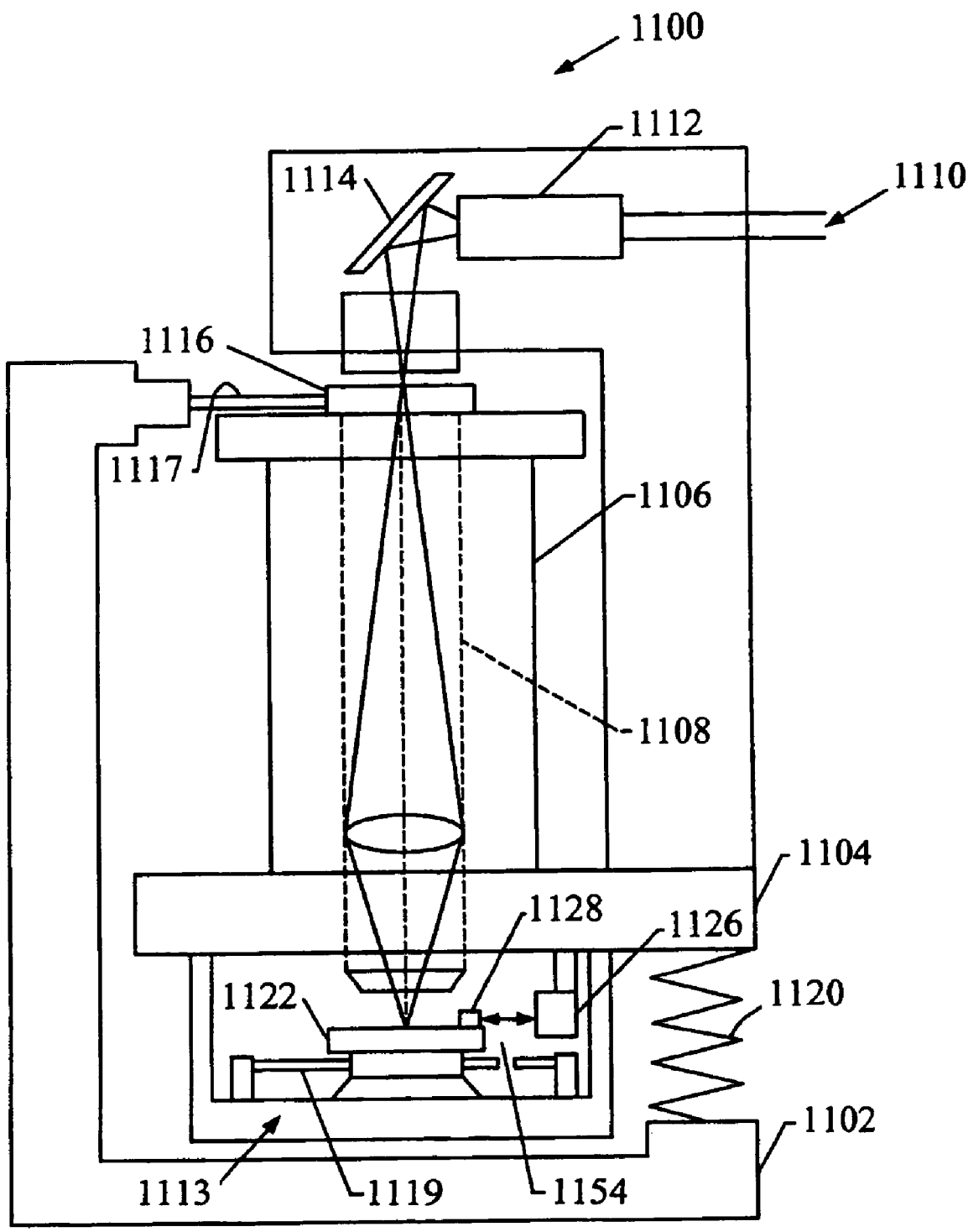
FIG. 8 is a schematic diagram of a lithography system.

An example of a lithography scanner 1100 using an interferometry system 1126 is shown in FIG. 8. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography. Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 9:
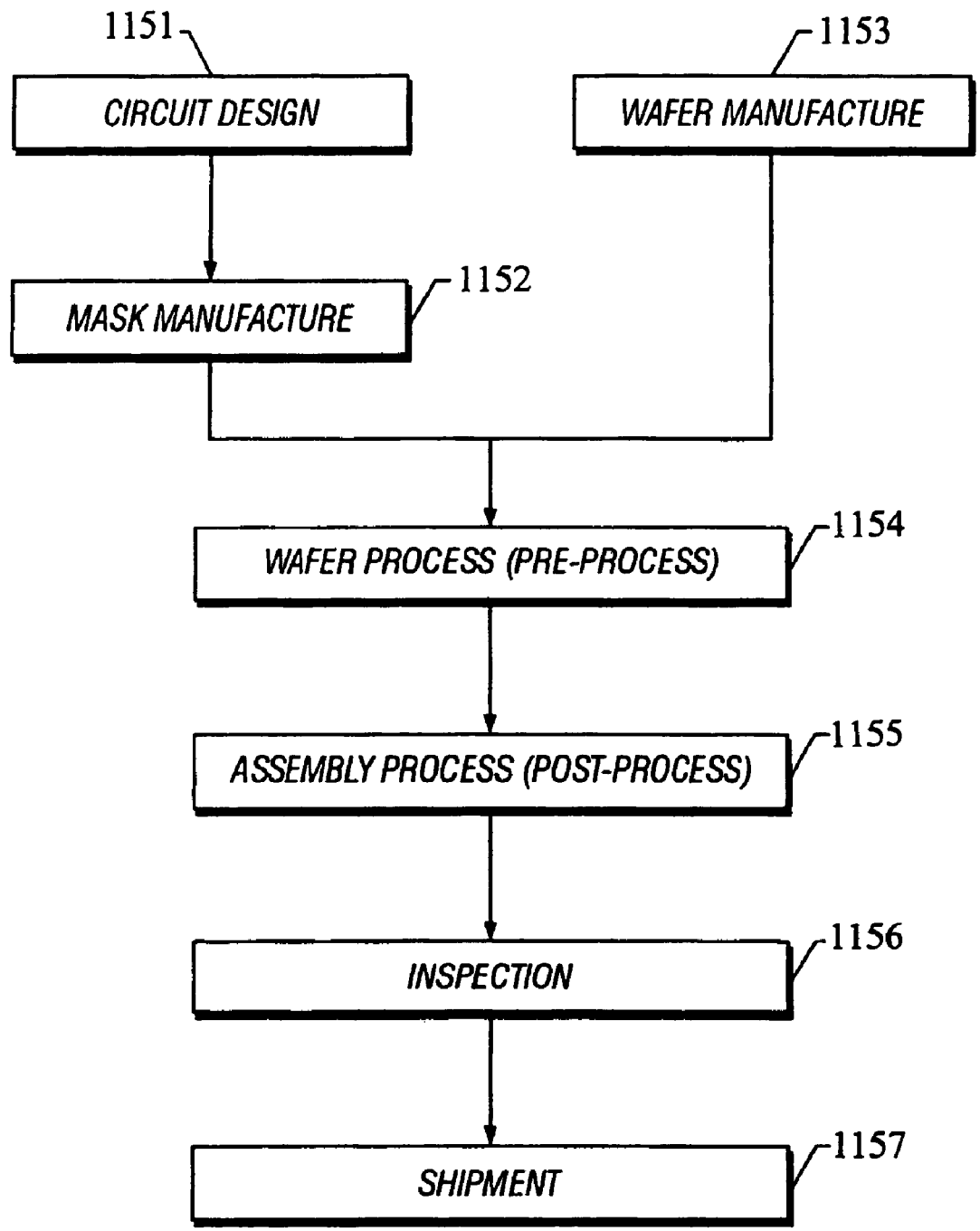
FIGS. 9 and 10 are flow charts that describe a process for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 9 and 10. FIG. 9 is a flow chart of the sequence of manufacturing a semiconductor device such as a semiconductor chip (e.g. IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 10:
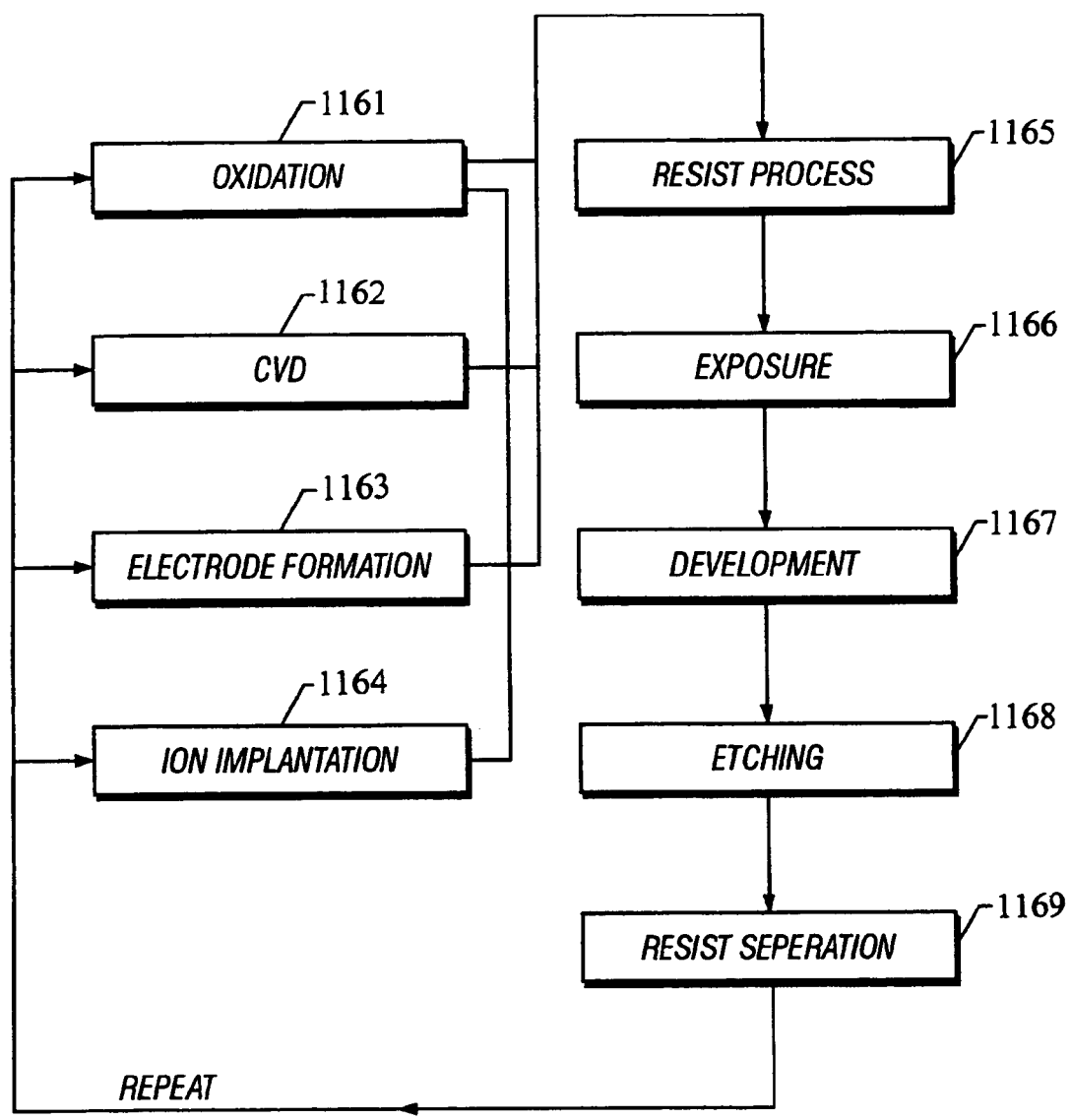

FIG. 10 is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 11:
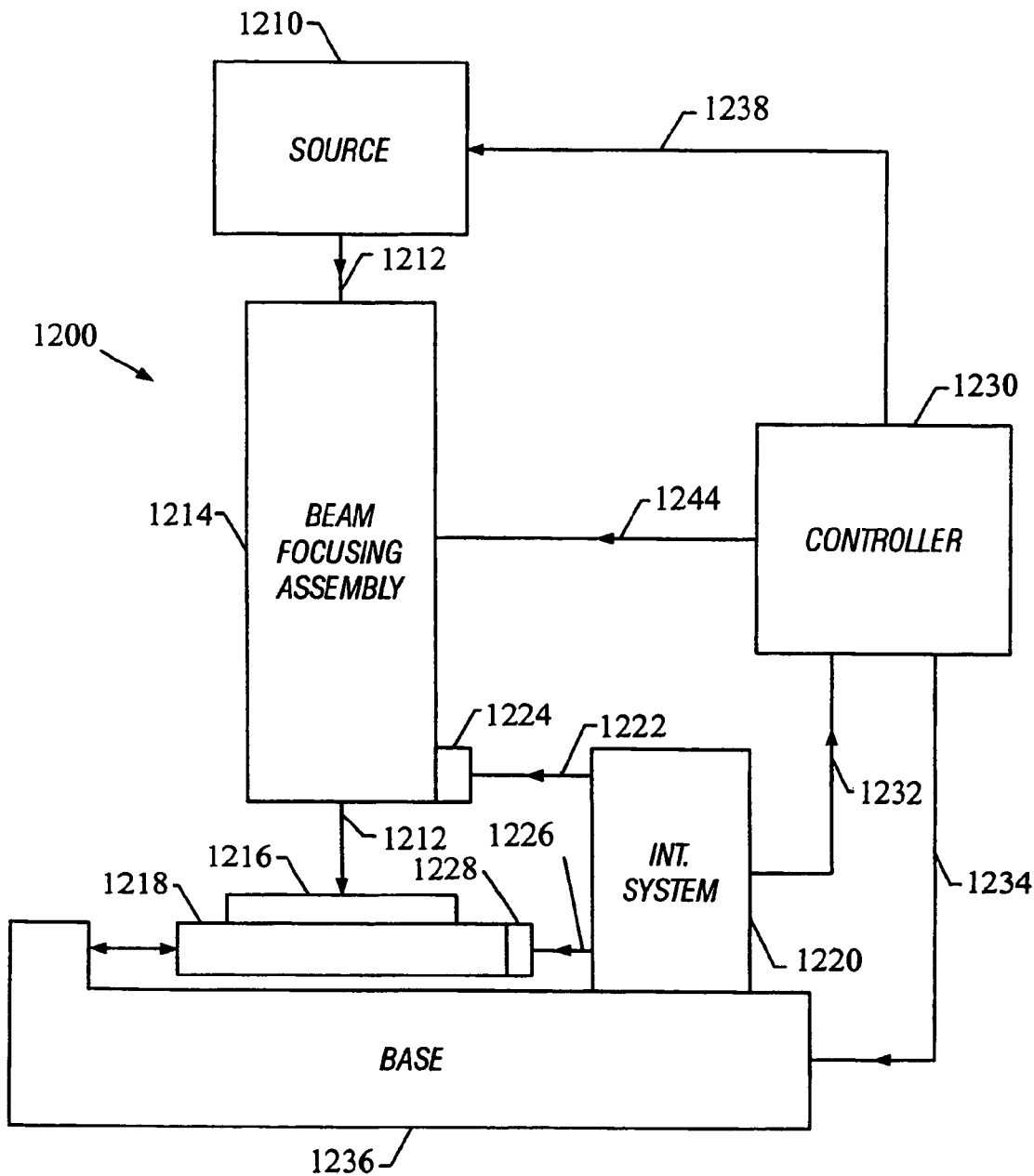
FIG. 11 is a schematic diagram of a beam writing system.

As an example, a schematic of a beam writing system 1200 is shown in FIG. 11. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

Figure 12:
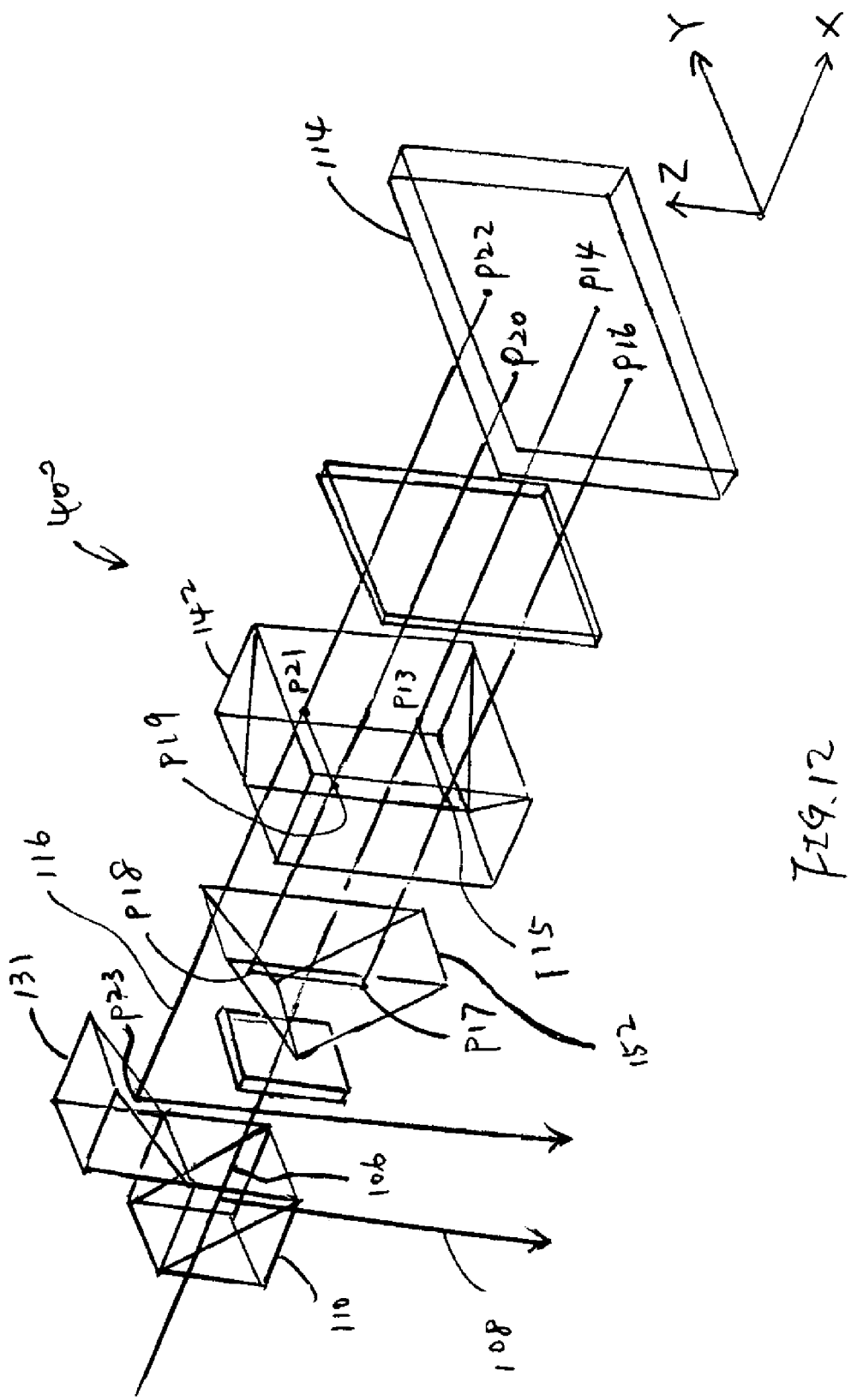

A number of embodiments of the invention have been described. Nevertheless, it will be understood that various modifications may be made without departing from the spirit and scope of the invention. For example, the relative positions of various optical components may be varied. Referring to FIG. 12, an interferometer 400 may be designed so that, in the first pass, a measurement beam 106 passes a point P13 in roof module 142 and is reflected by a stage mirror 114 at a point P14. Beam 106 contacts point P13 and a point P15 in roof module 142. In the second pass, beam 106 contacts a point P16 on mirror 114 and passes point P15. Beam 106 contacts points P17 and P18 on roof prism 152. In the third pass, beam 106 passes point P13 and is reflected by mirror 114 at a point P20. Beam 106 contacts point P19 and a point P21 on roof module 142. In the fourth pass, beam 106 is reflected by mirror 114 at a point P22, passes point P21 and forms intermediate beam 116, which is reflected by a fold mirror 131 at a point P23. The optical components for manipulating a reference beam 108 may be adjusted similarly. Roof prism 152 and roof module 142 may be rotated by 90° about the X-axis so that in the first and second passes, the measurement beam travels along paths that lie on a plane parallel to the X-Z plane, and in the third and fourth passes, the measurement beam travels along paths that lie on another plane parallel to the X-Z plane.

Figure 13:
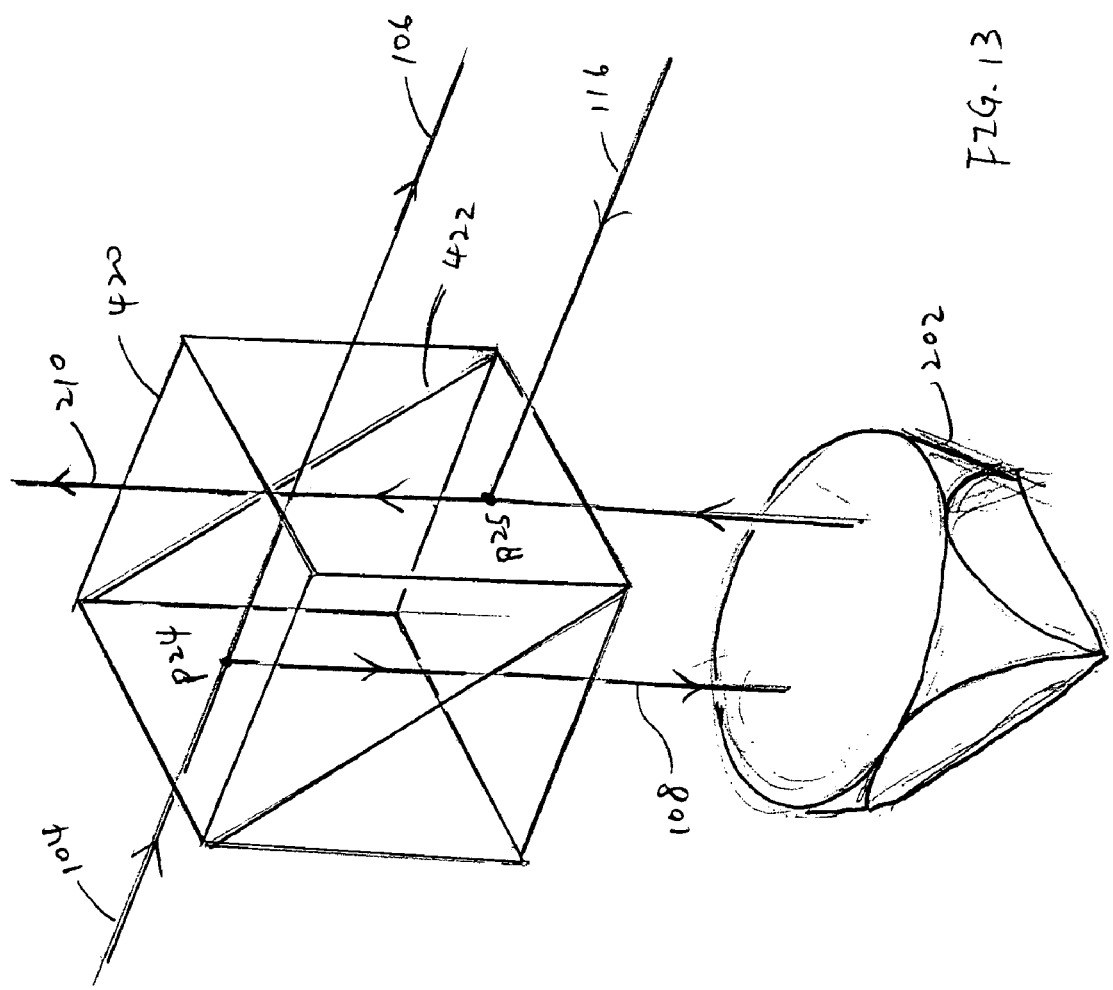
Figure 14:
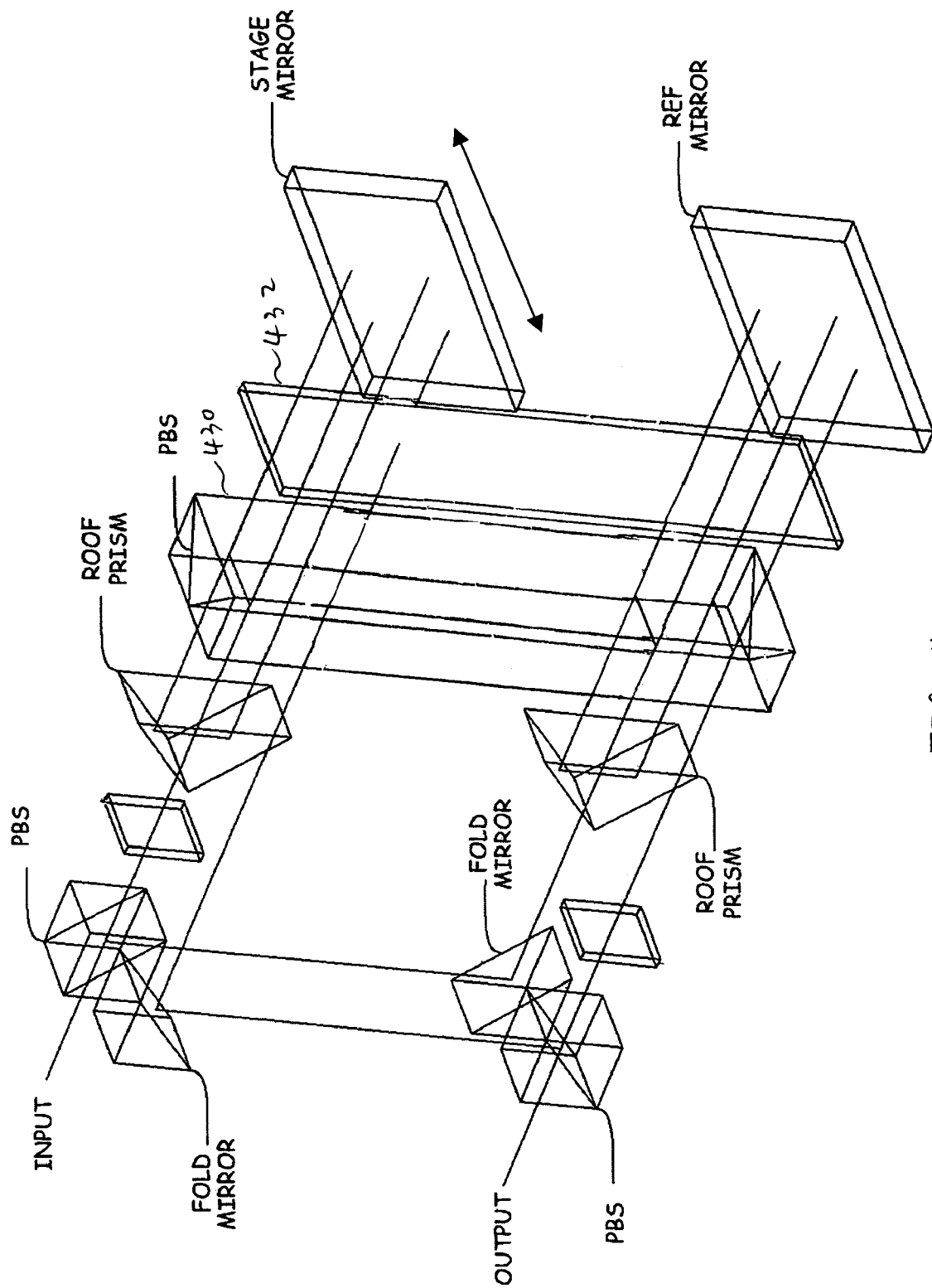

The PBS 102 and PBS 206 in FIG. 4 can be combined into one surface. For example, referring to FIG. 13, a larger polarizing beam-splitting cube 420 has a PBS 422 that separates input beam 104 into measurement beam 106 and reference beam 108 at a point P24. A retroreflector 202 redirects beam 108 so that the redirected beam combines with intermediate beam 116 at a point P25 on PBS 422 to form the overlapping pair of output beams 210. In FIG. 1, the dual PBS roof modules 142 and 160 can be replaced by a single extended dual PBS roof module, and the quarter wave retarders 148 and 163 can be replaced by a single quarter wave retarder, as shown in FIG. 14.

Accordingly, other embodiments are within the scope of the following claims.

What is claimed is:

1. Interferometric apparatus comprising:
   a first beam-splitting surface positioned to separate an input beam into a first beam and a second beam; and
   a first set of optics positioned to receive the first beam, direct it to contact a first reflector multiple times and produce a first intermediate beam, the first intermediate beam following a nominal output path when the first reflector has a first alignment normal to the first beam prior to reflection by the first reflector;
   wherein the first set of optics comprises a second beam-splitting surface, a third beam-splitting surface, and a first fold optic positioned to reduce displacement of the first intermediate beam from the nominal output path when the first reflector has an alignment different from the first alignment.

2. The interferometric apparatus of claim 1, wherein the first beam-splitting surface is further positioned to combine the first intermediate beam with a second intermediate beam derived from the second beam to produce an overlapping pair of output beams.

3. The interferometric apparatus of claim 1, further comprising a second beam-splitting surface positioned to combine the first intermediate beam with a second intermediate beam derived from the second beam to produce an overlapping pair of output beams.

4. The interferometric apparatus of claim 1, further comprising a steering wedge positioned to adjust a propagation direction of the first intermediate beam to increase an overlap between the overlapping pair of output beams.

5. The interferometric apparatus of claim 1, further comprising a second set of optics positioned to receive the second beam, direct it to contact a second reflector multiple times and produce a second intermediate beam, the second intermediate beam following the nominal output path when the second reflector has a first alignment normal to the second beam prior to reflection by the second reflector.

6. The interferometric apparatus of claim 5, wherein the second set of optics comprises a fourth beam-splitting surface, a fifth beam-splitting surface, and a second fold optic positioned to reduce displacement of the second intermediate beam from the nominal output path when the second reflector has an alignment different from the second alignment.

7. The interferometric apparatus of claim 6, wherein the fourth beam-splitting surface is parallel to the second beam-splitting surface, and the fifth beam-splitting surface is parallel to the third beam-splitting surface.

8. The interferometric apparatus of claim 1, wherein the second and third beam-splitting surfaces comprise polarizing beam-splitting surfaces.

9. The interferometric apparatus of claim 1, wherein the first beam-splitting surface comprises a polarizing beam-splitting surface.

10. The interferometric apparatus of claim 1, wherein the first set of optics are positioned to cause the first intermediate beam to follow the nominal output path when the first reflecting element has a second alignment different from the first alignment.

11. The interferometric apparatus of claim 1, wherein the second and third beam-splitting surfaces are perpendicular to each other.

12. The interferometric apparatus of claim 11, wherein the first fold optic comprises a first reflecting surface and a second reflecting surface that are perpendicular to each other.

13. The interferometric apparatus of claim 12, wherein the second and third beam-splitting surfaces intersect at a first line, the first and second reflecting surfaces intersect at a second line, the first line being perpendicular to the second line.

14. The interferometric apparatus of claim 1, wherein the second and third beam-splitting surfaces and reflecting surfaces of the first fold optic are positioned so that when the first beam contacts any of the surfaces, the first beam has a polarization direction parallel to the surface.

15. The interferometric apparatus of claim 1, wherein when the first reflector has the first alignment and the first beam is reflected by a surface in the first set of optics, the incident angle of the first beam relative to the surface is substantially equal to 45°.

16. A lithography system for use in fabricating integrated circuits on a wafer, the system comprising:
a stage for supporting the wafer;
an illumination system for imaging spatially patterned radiation onto the wafer;
a positioning system for adjusting the position of the stage relative to the imaged radiation; and
the apparatus of claim 1 for monitoring the position of the wafer relative to the imaged radiation.

17. A method for fabricating integrated circuits, the method comprising using the lithography apparatus of claim 16.

18. A lithography system for use in fabricating integrated circuits on a wafer, the system comprising:
a stage for supporting the wafer; and
an illumination system including a radiation source, a mask, a positioning system, a lens assembly, and the interferometric apparatus of claim 1,
wherein during operation the source directs radiation through the mask to produce spatially patterned radiation, the positioning system adjusts the position of the mask relative to the radiation from the source, the lens assembly images the spatially patterned radiation onto the wafer, and the interferometric apparatus monitors the position of the mask relative to the radiation from the source.

19. A method for fabricating integrated circuits, the method comprising using the lithography apparatus of claim 18.

20. A beam writing system for use in fabricating a lithography mask, the system comprising:
a source providing a write beam to pattern a substrate;
a stage supporting the substrate;
a beam directing assembly for delivering the write beam to the substrate;
a positioning system for positioning the stage and beam directing assembly relative one another; and
the apparatus of claim 1 for monitoring the position of the stage relative to the beam directing assembly.

21. Apparatus comprising:
a beam separating device to separate an input beam into a first beam and a second beam; and
a first set of optics to receive the first beam and to direct the first beam along multiple passes that pass through a portion of the first set of optics, in each pass the first beam propagates towards the first reflector and is reflected by the first reflector, the first set of optics including a first beam-splitting surface and a second beam-splitting surface,
the multiple passes including a first set of passes and a second set of passes, the first reflector having a first alignment that is normal to the propagation direction of the first beam prior to reflection by the first reflector,
the first beam following a first nominal beam path when the first reflector has the first alignment,
the path of the first beam being sheared relative to the first nominal beam path during the first set of passes and during the second set of passes if the first reflector has an alignment other than the first alignment, the first set of optics including a first fold optic to redirect the first beam after the first set of passes and before the second set of passes so that shear imparted during the second set of passes reduces or cancels shear imparted during the first set of passes.

22. The apparatus of claim 21, wherein the first and second beam-splitting surfaces reflect the first beam between the first and second passes and between the third and fourth passes.

23. The apparatus of claim 21, further comprising a second set of optics to receive the second beam and direct the second beam along multiple passes through a portion of the second set of optics, the second set of optics including a third beam-splitting surface and a fourth beam-splitting surface,
the multiple passes through the second set of optics including a third set of passes and a fourth set of passes,
the second reflector having a second alignment that is normal to the propagation direction of a portion of the second beam that is reflected by the second reflector,
the path of the second beam being sheared during the third set of passes and during the fourth set of passes through the second set of optics if the second reflector has an alignment other than the second alignment,
the second set of optics including a second fold optic to redirect the second beam after the third set of passes and before the fourth set of passes so that shear imparted during the fourth set of passes reduces or cancels shear imparted during the third set of passes.

24. The apparatus of claim 23, further comprising a beam combining device to combine the first beam and the second beam into an overlapping pair of output beams after the first beam completes the first and second set of passes and the second beam completes the third and fourth set of passes.

25. The apparatus of claim 21, wherein during the first set of passes, the first beam passes through the first beam-splitting surface, is reflected in sequence by the first reflector, the first beam-splitting surface, the second beam-splitting surface, and the first reflector, then passes through the second beam-splitting surface.

26. A multiple-pass interferometer comprising:
a first set of optics in cooperation with a measurement mirror to direct a measurement beam along a measurement path that passes through a portion of the first set of optics multiple times to produce a first intermediate beam;
a second set of optics in cooperation with a reference mirror to direct a reference beam along a reference path that passes through a portion of the second set of optics multiple times to produce a second intermediate beam; and
a combining optical element to combine the first and second intermediate beams to form an overlapping pair of output beams, the first and second sets of optics each having at least two reflecting surfaces and at least one beam-splitting surface positioned to reduce relative beam shear between the first and second intermediate beams caused by either the measurement mirror being at an angle relative to a first predefined position and/or the reference mirror being at an angle relative to a second predefined position.

27. The apparatus of claim 26, wherein the beam-splitting surface in each of the first and second sets of optics comprises a polarizing beam-splitting surface.

28. The apparatus of claim 26, wherein the first set of optics comprises a first beam-splitting surface and a second beam-splitting surface.

29. The apparatus of claim 28, wherein the first and second beam-splitting surfaces are perpendicular to each other.

30. The apparatus of claim 28, wherein the second set of optics includes a third beam-splitting surface and a fourth beam-splitting surface, the third beam-splitting surface being parallel to the first beam-splitting surface, and the fourth beam-splitting surface being parallel to the second beam-splitting surface.

31. The apparatus of claim 26, wherein the first set of optics comprises at least one corner cube retroreflector that in cooperation with the beam-splitting surface and the measurement mirror directs the measurement beam along the measurement path.

32. The apparatus of claim 26, wherein the measurement path passes through a portion of the first set of optics in at least a first set of passes and a second set of passes, the at least two reflecting surfaces and at least one beam-splitting surface of the first set of optics are positioned so that shear imparted to the measurement path during the first set of passes is compensated by shear imparted to the measurement path during the second set of passes when the measurement mirror is at an angle relative to the first predefined position.

33. A method comprising:
separating an input beam into a first beam and a second beam; and
directing the first beam through a first set of optics to contact a first reflector multiple times to produce a first intermediate beam, the first intermediate beam following a nominal output path when the first reflector has a first alignment normal to the first beam prior to reflection by the first reflector, the first set of optics comprising a first pair of beam-splitting surfaces and a first fold optic positioned to reduce displacement of the first intermediate beam from the nominal output path when the first reflector has an alignment different from the first alignment.

34. The method of claim 33, further comprising combining the first intermediate beam with a second intermediate beam derived from the second beam to produce an overlapping pair of output beams.

35. The method of claim 33, further comprising directing the second beam through a second set of optics to contact a second reflector multiple times to produce a second intermediate beam, the second intermediate beam following the nominal output path when the second reflector has a first alignment normal to the second beam prior to reflection by the second reflector, the second set of optics comprising a second pair of beam-splitting surfaces and a second fold optic positioned to reduce displacement of the second intermediate beam from the nominal output path when the second reflector has an alignment different from the second alignment.

36. A lithography method for use in fabricating integrated circuits on a wafer, the method comprising:
supporting the wafer on a moveable stage;
imaging spatially patterned radiation onto the wafer;
adjusting the position of the stage; and
monitoring the position of the stage using the method of claim 33.

37. A method for fabricating integrated circuits, the method comprising the lithography method of claim 36.

38. A lithography method for use in the fabrication of integrated circuits comprising:
directing input radiation through a mask to produce spatially patterned radiation;
positioning the mask relative to the input radiation;
monitoring the position of the mask relative to the input radiation using the method of claim 33; and
imaging the spatially patterned radiation onto a wafer.

39. A method for fabricating integrated circuits, the method comprising the lithography method of claim 38.

40. A lithography method for fabricating integrated circuits on a wafer comprising:
positioning a first component of a lithography system relative to a second component of a lithography system to expose the wafer to spatially patterned radiation; and
monitoring the position of the first component relative to the second component using the method of claim 33.

41. A method for fabricating integrated circuits, the method comprising the lithography method of claim 40.

42. A method for fabricating a lithography mask, the method comprising:
directing a write beam to a substrate to pattern the substrate;
positioning the substrate relative to the write beam; and
monitoring the position of the substrate relative to the write beam using the interferometry method of claim 33.

43. A method comprising:
assembling a first beam-splitting surface, a first set of optics, and a beam-combining surface to form an interferometer;
wherein the first beam-splitting surface during operation of the interferometer separates an input beam into a measurement beam and a reference beam;
wherein the first set of optics comprises a first pair of beam-splitting surfaces and a first fold optic that are positioned to direct the measurement beam to contact a measurement mirror multiple times to form a first intermediate beam, the first intermediate beam following a nominal output path when the measurement mirror has a normal alignment, the first pair of beam-splitting surfaces and the first fold optic positioned to reduce displacement of the first intermediate beam from the nominal output path when the first reflector has an alignment different from the normal alignment; and
wherein the beam-combining surface is positioned to combine the first intermediate beam with a second intermediate beam derived from the reference beam to form an overlapping pair of output beams.

44. The method of claim 43, further comprising assembling a second set optics with the first beam-splitting surface, the first set of optics, and the beam-combining surface to form the interferometer;
wherein the second set of optics comprises a second pair of beam-splitting surfaces and a second fold optic positioned to direct the reference beam to contact a reference mirror multiple times to form the second intermediate beam, the second intermediate beam following a nominal output path when the reference mirror has a normal alignment, the second pair of beam-splitting surfaces and the second fold optic positioned to reduce displacement of the second intermediate beam from the nominal output path when the second reflector has an alignment different from the normal alignment.

45. The method of claim 43, wherein assembling the first beam-splitting surface, the first set of optics, and the beam-combining surface to form the interferometer comprises positioning the first pair of beam-splitting surfaces so that they are perpendicular to each other and intersect at a first line, positioning the first pair of reflecting surfaces so that they are perpendicular to each other and intersect at a second line, the first line being perpendicular to the second line.

46. A method comprising:

separating an input beam into a first beam and a second beam;

directing the first beam along multiple passes that pass through a portion of a first set of optics, in each pass the first beam propagates towards a first reflector and is reflected by the first reflector, the first set of optics including a first beam-splitting surface and a second beam-splitting surface that reflect the first beam multiple times, the multiple passes including a first set of passes and a second set of passes, the first reflector having a first alignment that is normal to the propagation direction of the first beam prior to reflection by the first reflector, the first beam following a first nominal beam path when the first reflector has the first alignment, the path of the first beam being sheared relative to the first nominal beam path during the first set of passes and during the second set of passes if the first reflector has an alignment other than the first alignment; and redirecting the first beam after the first set of passes and before the second set of passes so that shear imparted during the second set of passes reduces or cancels shear imparted during the first set of passes.

47. The method of claim 46, further comprising directing the second beam along multiple passes through a portion of a second set of optics, the second set of optics including a third beam-splitting surface and a fourth beam-splitting surface that reflect the second beam multiple times, the multiple passes through the second set of optics including a third set of passes and a fourth set of passes, the second reflector having a second alignment that is normal to the propagation direction of a portion of the second beam that is reflected by the second reflector, the path of the second beam being sheared during the third set of passes and during the fourth set of passes through the second set of optics if the second reflector has an alignment other than the second alignment; and redirecting the second beam after the third set of passes and before the fourth set of passes so that shear imparted during the fourth set of passes reduces or cancels shear imparted during the third set of passes.

48. The method of claim 47, further comprising combining the first beam and the second beam into an overlapping pair of output beams after the first beam completes the first and second set of passes and the second beam completes the third and fourth set of passes.

49. A method comprising:

separating an input beam into a measurement beam and a reference beam;

directing the measurement beam to passes through a first beam-splitting surface;

reflecting the measurement beam in sequence by a measurement mirror, the first beam-splitting surface, a second beam-splitting surface, and the measurement mirror;

directing the measurement beam to pass through the second beam-splitting surface; and combining the measurement beam with the reference beam to form an overlapping pair of output beams.

50. The method of claim 49, further comprising redirecting the measurement beam using a fold optic so that the measurement beam passes through the second beam-splitting surface a second time, and is reflected in sequence by the measurement mirror, the second beam-splitting surface, the first beam-splitting surface, and the measurement mirror.

51. A method comprising:

directing a measurement beam along a measurement path that passes through a first set of optics and contacts a measurement mirror multiple times to produce a first intermediate beam, the measurement beam passing through a portion of the first set of optics multiple times;

directing a reference beam along a reference path that passes through a second set of optics and contacts a reference mirror multiple times to produce a second intermediate beam, the reference beam passing through a portion of the second set of optics multiple times; and combining the first and second intermediate beams to form an overlapping pair of output beams, the first and second set of optics each having at least two reflecting surfaces and at least one beam-splitting surface positioned to reduce relative beam shear between the first and second intermediate beams caused by either the measurement mirror being at an angle relative to a first predefined position and/or the reference mirror being at an angle relative to a second predefined position.

52. The method of claim 51, further comprising directing the measurement beam to pass through a portion of the first set of optics in at least a first set of passes and a second set of passes, and positioning the at least two reflecting surfaces and at least one beam-splitting surface of the first set of optics so that shear imparted to the measurement path during the first set of passes is compensated by shear imparted to the measurement path during the second set of passes when the measurement mirror is at an angle relative to the first predefined position.

\* \* \* \* \*

UNITED STATES PATENT AND TRADEMARK OFFICE
CERTIFICATE OF CORRECTION

| | | |
|---|---|---|
| PATENT NO. | : 7,046,370 B2 | Page 1 of 1 |
| APPLICATION NO. | : 10/603120 | |
| DATED | : May 16, 2006 | |
| INVENTOR(S) | : Andrew Eric Carlson | |

It is certified that error appears in the above-identified patent and that said Letters Patent is hereby corrected as shown below:

Column 12
Line 34, delete "an" (two occasions) and insert --a--

Column 13
Line 22, delete "roof module 146" and insert --roof module 142--
Line 42, delete "a" before "point" and insert --at--

Column 19
Line 25, delete "produce" and insert --produced--
Line 53, insert --to-- after "relative"

Column 26
Line 47, insert --of-- after "set"

Signed and Sealed this

Seventeenth Day of July, 2007

JON W. DUDAS
*Director of the United States Patent and Trademark Office*